(12) United States Patent
Inoue et al.

(10) Patent No.: US 8,230,806 B2
(45) Date of Patent: Jul. 31, 2012

(54) HEAT TREATMENT METHOD AND HEAT TREATMENT APPARATUS WHEREIN THE SUBSTRATE HOLDER IS COMPOSED OF TWO HOLDER CONSTITUTING BODIES THAT MOVE RELATIVE TO EACH OTHER

(75) Inventors: Hisashi Inoue, Fuchu (JP); Shunichi Matsumoto, Oshu (JP); Yasushi Takeuchi, Oshu (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 12/987,406

(22) Filed: Jan. 10, 2011

(65) Prior Publication Data
US 2011/0162633 A1   Jul. 7, 2011

Related U.S. Application Data

(62) Division of application No. 12/232,751, filed on Sep. 23, 2008, now Pat. No. 7,900,579.

(30) Foreign Application Priority Data

Sep. 26, 2007 (JP) ................. 2007-249039
Sep. 26, 2007 (JP) ................. 2007-249040

(51) Int. Cl.
*B05B 5/00* (2006.01)
*C23C 16/00* (2006.01)
(52) U.S. Cl. ........ 118/641; 118/715; 118/724; 118/729; 118/730; 432/241
(58) Field of Classification Search .................. 118/641, 118/715, 724, 729, 730; 432/241
See application file for complete search history.

(56) References Cited

U.S. PATENT DOCUMENTS

| | | | |
|---|---|---|---|
| 4,615,298 A | 10/1986 | Yamazaki | |
| 4,661,033 A | 4/1987 | Worsham | |
| 4,745,088 A | 5/1988 | Inoue et al. | |

(Continued)

FOREIGN PATENT DOCUMENTS

JP        62-48078        3/1987

(Continued)

OTHER PUBLICATIONS

Chinese Office Action issued on Sep. 9, 2010 for Application No. 200810161425.5 w/ English language translation.

(Continued)

*Primary Examiner* — Charles Garber
*Assistant Examiner* — Ron Pompey
(74) *Attorney, Agent, or Firm* — Smith, Gambrell & Russell, LLP

(57) ABSTRACT

A heat treatment apparatus has a substrate holder with two holder constituting bodies that each have a plurality of columns and substrate holding sections. One of the holder constituting bodies holds substrates so that their front surfaces face upward, while the other holds the substrates so that their back surfaces face upward. At least one of the holder constituting bodies moves vertically to change the positions of the holder constituting bodies relative to each other. A distance between one of a first pair of vertically-adjacent substrates with respective front surfaces facing each other and the other of the first pair of substrates is set to ensure treatment uniformity and to be larger than a distance between one of a second pair of vertically-adjacent substrates with their respective back surfaces facing each other and the other of the second pair of substrates.

5 Claims, 16 Drawing Sheets

U.S. PATENT DOCUMENTS

| | | | |
|---|---|---|---|
| 5,020,476 A | | 6/1991 | Bay et al. |
| 5,048,164 A | * | 9/1991 | Harima ................. 29/25.01 |
| 5,055,036 A | * | 10/1991 | Asano et al. ............... 432/5 |
| 5,565,034 A | * | 10/1996 | Nanbu et al. ............ 118/668 |
| 5,653,810 A | * | 8/1997 | Kataoka et al. ....... 118/723 E |
| 6,692,209 B1 | * | 2/2004 | Pruet et al. ................ 414/217 |
| 2002/0113027 A1 | * | 8/2002 | Minami et al. ........... 211/41.18 |
| 2003/0029570 A1 | * | 2/2003 | Kawamura et al. ...... 156/345.51 |

FOREIGN PATENT DOCUMENTS

| | | |
|---|---|---|
| JP | 10-053488 | 2/1998 |
| JP | 2001-223254 | 8/2001 |
| KR | 2000-0025669 | 5/2000 |
| KR | 10-2005-0040035 | 5/2005 |

OTHER PUBLICATIONS

Korean Office Action issued on Jul. 18, 2011 for Application No. 10-2008-94070 w/ English language translation.

Office Action for corresponding Japanese Patent Application No. 2007-249039.

Office Action for corresponding Japanese Patent Application No. 2007-249040.

* cited by examiner

HEAT TREATMENT METHOD AND HEAT TREATMENT APPARATUS WHEREIN THE SUBSTRATE HOLDER IS COMPOSED OF TWO HOLDER CONSTITUTING BODIES THAT MOVE RELATIVE TO EACH OTHER

CROSS REFERENCE TO RELATED APPLICATION

This application is a division of Ser. No. 12/232,751, filed Sep. 23, 2008, which is being incorporated in its entirety herein by reference.

The present application benefits from Japanese applications JP2007-249039 and JP2007-249040 filed on Sep. 26, 2007, the disclosure of which is hereby incorporated by reference into this application.

BACKGROUND OF THE INVENTION

1. Field of the Invention

The present invention relates to a heat treatment method and a heat treatment apparatus, and more particularly to a technique for performing a heat treatment on an increased number of substrates with uniformity of the treatment ensured.

2. Description of the Related Art

In the process for manufacturing semiconductor devices, various treatment apparatuses (semiconductor manufacturing apparatuses) are used to perform treatments such as oxidization, diffusion, and chemical vapor deposition (CVD) on substrates to be treated, e.g., semiconductor wafers (hereinafter also referred to as wafers). As one of the treatment apparatuses, a heat treatment apparatus is known, which is capable of performing a heat treatment on multiple substrates simultaneously.

The abovementioned heat treatment apparatus has a heat treating furnace and a boat. The boat is a substrate holder, which holds multiple wafers at a predetermined vertical interval and is carried into and out of the heat treating furnace (refer to JP-A-2001-223254). In addition, the heat treatment apparatus includes an elevation mechanism and a transfer mechanism. The elevation mechanism and the transfer mechanism are located in a loading area (operation area) present under the heat treating furnace. The elevation mechanism is operable to lift and lower a lid under the condition that the boat is placed on a thermal insulation tube (that is furnace throat heat insulating means) present on the lid for closing the furnace throat in order that the boat is carried into the heat treating furnace from the loading area and carried out of the heat treating furnace into the loading area. The transfer mechanism is operable to transfer wafers between the boat carried into the loading area and a container capable of accommodating the wafers.

The boat has a plurality of columns between a bottom plate and a top plate. Each of the columns has substrate holding sections arranged at a predetermined vertical interval (pitch). The substrate holding sections are grooves or protrusions for holding edge portions of the wafers. All the wafers are held by the boat under the condition that front surfaces (to be treated) of the wafers face upward.

However, the minimum pitch of the substrate holding sections, which depends on the number of wafers to be held by the boat, is determined based on uniformity of the surface (to be treated) of each of the wafers, uniformity between the surfaces (to be treated) of the wafers and the number of the wafers to be placed. It is, therefore, difficult to increase the number of wafers to be held by the boat. If the pitch is increased to improve the uniformity of the surface of each of the wafers and the uniformity between the surfaces of the wafers, the number of the wafers is reduced.

SUMMARY OF THE INVENTION

It is, therefore, an object of the present invention to provide a heat treatment method and a heat treatment apparatus, which are capable of solving the problems of the conventional technique and increasing the number of wafers held by a substrate holder compared with the conventional techniques while uniformity of the treatment is ensured.

According to a first aspect of the present invention, a heat treatment method, in which a plurality of substrates to be treated is held by a substrate holder at predetermined vertical intervals, the substrate holder is carried into a heat treating furnace, and a predetermined heat treatment is performed on the substrates, comprises the steps of: arranging the substrates in the substrate holder such that front surfaces or back surfaces of the substrates vertically adjacent to each other face each other; and setting a first distance between one of a first pair of substrates that are vertically adjacent each other and have the respective front surfaces facing each other and the other of the first pair of substrates to ensure uniformity of the treatment, and setting a second distance between one of a second pair of substrates that are vertically adjacent each other and have the respective back surfaces facing each other and the other of the second pair of substrates to be smaller than the first distance.

According to a second aspect of the present invention, in the heat treatment method, the substrate holder is composed of two holder constituting bodies; each of the holder constituting bodies has a plurality of columns each including a plurality of substrate holding sections, the substrate holding sections of each of the holder constituting bodies being arranged at a predetermined vertical interval and adapted to hold circumferential portions of the substrates, the columns being arranged on the circumference of the same imaginary circle; one of the holder constituting bodies holds the substrates under the condition that the front surfaces of the substrates face upward, and the other of the holder constituting bodies holds the substrates under the condition that the back surfaces of the substrates face upward, so that the substrate with the front surface facing upward and the substrate with the back surface facing upward are alternately arranged in a vertical direction; and at least one of the two holder constituting bodies moves up and down to change the positions of the two holder constituting bodies relative to each other so that the first distance is set to ensure the uniformity of the treatment and larger than the second distance.

According to a third aspect of the present invention, the heat treatment method further comprises the step of pivoting at least one of the two holder constituting bodies in the circumferential direction to change the positions of the two holder constituting bodies relative to each other so that the columns surround the circumferential portions of the substrates under the condition that the distance between any two of the columns is smaller than the diameters of the substrates.

According to a fourth aspect of the present invention, a heat treatment apparatus comprises a substrate holder for holding a plurality of substrates at predetermined vertical intervals and a heat treating furnace for receiving the substrate holder and allowing a predetermined heat treatment to be performed on the substrates therein, wherein the substrate holder has a plurality of substrate holding sections for holding end portions of the substrates under the condition that the substrate having a front surface facing upward and the substrate having a back surface facing upward are alternately arranged in a vertical direction; and the substrate holding sections are arranged such that a first distance between one of a first pair of substrates that are vertically adjacent each other and have the respective front surfaces facing each other and the other of the first pair of substrates is set to ensure uniformity of the treatment and larger than a second distance between one of a second pair of substrates that are vertically adjacent each other and have the respective back surfaces facing each other and the other of the second pair of substrates.

According to a fifth aspect of the present invention, in the heat treatment apparatus, the substrate holder is composed of two holder constituting bodies; each of the holder constituting bodies has a plurality of columns each including a plurality of substrate holding sections, the substrate holding sections of each of the holder constituting bodies being arranged at a predetermined vertical interval and adapted to hold circumferential portions of the substrates, the columns being arranged on the circumference of the same imaginary circle; one of the holder constituting bodies holds the substrates under the condition that the front surfaces of the substrates face upward; the other of the holder constituting bodies holds the substrates under the condition that the back surfaces of the substrates face upward; the two holder constituting bodies are combined such that the substrate with the front surface facing upward and the substrate with the back surface facing upward are alternately arranged in the vertical direction; and at least one of the two holder constituting bodies is capable of moving up and down by a vertical movement mechanism to change the positions of the two holder constituting bodies relative to each other in order that the first distance is set to ensure the uniformity of the treatment and larger than the second distance.

According to a sixth aspect of the present invention, in the heat treatment apparatus, a substrate holder rotating mechanism is provided under a lid for closing a furnace throat of the heat treating furnace and has a rotating shaft; and the vertical movement mechanism has an elevation shaft and an elevation drive section, the elevation shaft extending through the rotating shaft of the substrate holder rotating mechanism and being capable of moving up and down, the elevation drive section being adapted to cause the elevation shaft to move up and down.

According to a seventh aspect of the present invention, in the heat treatment apparatus, a thermal insulation tube is provided on the lid for closing a furnace throat of the heat treating furnace; the vertical movement mechanism is composed of an elevation mechanism and a latch mechanism; the elevation mechanism carries holder constituting bodies of the substrate holder into and out of the heat treating furnace; and the latch mechanism latches one of the holder constituting bodies when the substrate holder is carried out of the heat treating furnace to restore the relationship between the position of the one of the holder constituting bodies relative to the position of the other of the holder constituting bodies.

According to an eighth aspect of the present invention, the heat treatment apparatus further comprises a pivoting mechanism for pivoting at least one of the holder constituting bodies in the circumferential direction to change the positions of the two holder constituting bodies relative to each other in order that the columns of the holder constituting bodies surround the circumferential portions of the substrates under the condition that a distance between any two of the columns is smaller than the diameters of the substrates.

According to a ninth aspect of the present invention, in the heat treatment apparatus, a substrate holder rotating mechanism is provided under the lid for closing a furnace throat of the heat treating furnace and has a rotating shaft, and the pivoting mechanism has an elevation shaft extending through the rotating shaft and being capable of pivoting and moving up and down the holder constituting body.

According to a tenth aspect of the present invention, in the heat treatment apparatus, the pivoting mechanism is composed of a latch mechanism and a substrate holder rotating mechanism; the latch mechanism latches one of the holder constituting bodies when the substrate holder is carried out of the heat treating furnace to restore the relationship between the vertical position of the one of the holder constituting bodies relative to the vertical position of the other of the holder constituting bodies; and the substrate holder rotating mechanism pivots the other of the holder constituting bodies in the circumferential direction by a predetermined angle with respect to the holder constituting body latched by the latch mechanism.

According to an eleventh aspect of the present invention, a heat treatment method, in which a plurality of substrates to be treated is held by a substrate holder at predetermined vertical intervals, the substrate holder is carried into a heat treating furnace, and a predetermined heat treatment is performed on the substrates, comprises the steps of: forming a multi-plate unit that uses a support ring to hold circumferential portions of two substrates under the condition that back surfaces of the two substrates face each other; and holding a plurality of the multi-plate units by means of the substrate holder at a vertical interval larger than a distance between the front surface of one of the two substrates held by the multi-plate unit and the back surface of the other of the two substrates such that a first distance between one of a first pair of substrates that are vertically adjacent each other and have the respective front surfaces facing each other and the back surface of the other of the first pair of substrates is larger than a second distance between one of a second pair of substrates that are vertically adjacent each other and have the respective back surfaces facing each other and the other of the second pair of substrates.

According to a twelfth aspect of the present invention, in the heat treatment method, each of the support rings has a first support ring and a second support ring; each of the first support rings holds the substrate under the condition that the back surface of the substrate faces upward; and each of the second support rings holds the substrate under the condition that the front surface of the substrate faces upward.

According to a thirteenth aspect of the present invention, in the heat treatment method, each of the first and second support rings has protrusions that protrude from the circumference thereof and are arranged at an appropriate interval; the protrusions of the second support ring of each of the support rings are placed on the protrusions of the first support ring of the support ring, and have respective thicknesses that allow a distance between the substrate held by the first support ring and the substrate held by the second support ring to be maintained to a predetermined value.

According to a fourteenth aspect of the present invention, a heat treatment method, in which a plurality of substrates to be treated is held by a substrate holder at predetermined vertical intervals, the substrate holder is carried into a heat treating furnace, and a predetermined heat treatment is performed on the substrates, comprises the steps of: holding the substrates at predetermined vertical intervals under the condition that back surfaces of the substrates face upward; forming a single-plate unit that uses a support ring to hold a circumferential portion of one of the substrates under the condition that a front surface of the substrate faces upward; and causing the substrate holder to hold the single-plate units by means of the support rings under the condition that the back surface of the substrate held by each of the single-plate units and the back surface of the substrate that is held by the substrate holder and located directly under the substrate held by the single-plate unit face each other such that a first distance one of a first pair of substrates that are vertically adjacent each other and have the respective front surfaces facing each other and the other of the first pair of substrates is larger than a second distance between one of a second pair of substrates that are vertically adjacent each other and have the respective back surfaces facing each other and the other of the second pair of substrates.

According to a fifteenth aspect of the present invention, in the heat treatment method, the substrate holder has a plurality of columns surrounding the end portions of the substrates; and each of the columns has claws and unit support sections, the claws holding the substrates, the unit support sections holding the single-plate units by means of protrusions of the support rings.

According to a sixteenth aspect of the present invention, a heat treatment apparatus holds a plurality of substrates at predetermined vertical intervals by means of a substrate holder, carries the substrate holder into a heat treating furnace, and performs a predetermined heat treatment on the substrates, wherein the substrate holder has a plurality of columns and a plurality of support rings; the support rings hold circumferential portions of the substrates to constitute a plurality of multi-plate units under the condition that back surfaces of two substrates held by each of the multi-plate units face each other; each of the columns has claws arranged in a vertical direction; the claws hold the support rings that hold the substrates such that a distance between upper surfaces of the claws vertically adjacent to each other is larger than a distance between the front surface of one of the two substrates held by the multi-plate unit and the back surface of the other of the two substrates; and a first distance between one of a first pair of substrates that are vertically adjacent each other and have the respective front surfaces facing each other and the other of the first pair of substrates is larger than a second distance between one of a second pair of substrates that are vertically adjacent each other and have the respective back surfaces facing each other and the other of the second pair of substrates.

According to a seventeenth aspect of the present invention, in the heat treatment apparatus, each of the support rings is composed of a first support ring and a second support ring, each of the first support rings holding the substrate under the condition that the back surface of the substrate faces upward, each of the second support rings holding the substrate under the condition that the front surface of the substrate faces upward.

According to an eighteenth aspect of the present invention, in the heat treatment apparatus, each of the first and second support rings has protrusions that protrude from the circumference thereof and are arranged at an appropriate interval; and the protrusions of the second support ring of each of the support rings are placed on the protrusions of the first support ring of the support ring and have respective thicknesses that allow a distance between the substrate placed on the first support ring of the support ring and the substrate placed on the second support ring to be maintained to a predetermined value.

According to a nineteenth aspect of the present invention, a heat treatment apparatus holds a plurality of substrates at predetermined vertical intervals by means of a substrate holder, carries the substrate holder into a heat treating furnace, and performs a predetermined heat treatment on the substrates, wherein the substrate holder has a plurality of columns and a plurality of support rings; each of the support rings holds a circumferential portion of one of the substrates to constitute a single-plate unit under the condition that a front surface of the substrate held by the single-plate unit faces upward; each of the columns has claws and unit support sections, the claws of each of the columns holding the substrates at the predetermined vertical interval under the condition that the back surfaces of the substrates face upward, the unit support sections holding the single-plate units by means of the support rings under the condition that the back surface of the substrate held by the claws and the back surface of the substrate that is held by the single-plate unit and located directly above the substrate held by the claws face each other; and a first distance between one of a first pair of substrates that are vertically adjacent each other and have the respective front surfaces facing each other and the other of the first pair of substrates is larger than a second distance between one of a second pair of substrates that are vertically adjacent each other and have the respective back surfaces facing each other and the other of the second pair of substrates.

According to a twentieth aspect of the present invention, in the heat treatment apparatus, the support ring of each of the single-plate units has protrusions that protrude from the circumference thereof and are arranged at an appropriate interval; and the unit support sections hold the protrusions.

According to the present invention, the substrate holder holds the substrates to be treated such that the substrate with the front surface facing upward and the substrate with the back surface facing upward are alternately arranged in the vertical direction. The first distance between the front surface of one of the first pair of substrates that are vertically adjacent to each other and have the respective front surfaces facing each other and the back surface of the other of the first pair of substrates is set to ensure uniformity of the treatment and larger than the distance between the front surface of one of the second pair of substrates that are vertically adjacent to each other and have the respective back surfaces facing each other and the back surface of the other of the second pair of substrates. The number of substrates held by the substrate holder is therefore increased compared with conventional techniques while the uniformity of the treatment is ensured. When the number of the substrates held by the substrate holder is the same as that in the conventional techniques and the distance between the front surface of one of the first pair of substrates that are vertically adjacent to each other and have the respective front surfaces facing each other and the back surface of the other of the first pair of substrates is increased, the uniformity of the treatment can be further improved while the number of the substrates is maintained.

According to the present invention, the substrate holder is composed of the two holder constituting bodies. Each of the holder constituting bodies has substrate holding sections and the plurality of columns. The substrate holding sections hold the end portions of the substrates. The columns are arranged on the circumference of the same imaginary circle. One of the holder constituting bodies holds the substrates under the condition that the front surfaces of the substrates face upward, while the other of the holder constituting bodies holds the substrates under the condition that the back surfaces of the substrates face upward. The substrate with the front surface facing upward and the substrate with the back surface facing upward are alternately arranged in the vertical direction. At least one of the holder constituting bodies moves up and down to change the positions of the holder constituting bodies relative to each other in order that the first distance between the front surface of one of the first pair of substrates that are vertically adjacent to each other and have the respective front surfaces facing each other and the back surface of the other of the first pair of substrates is set to ensure the uniformity of the treatment and larger than the distance between the front surface of one of the second pair of substrates that are vertically adjacent to each other and have the respective back surfaces facing each other and the back surface of the other of the second pair of substrates. The number of the substrates is therefore increased compared with the conventional techniques while the uniformity of the treatment is ensured. When the number of the substrates held by the substrate holder is the same as that in the conventional techniques, and the first distance between the front surface of one of the first pair of substrates that are vertically adjacent to each other and have the respective front surfaces facing each other and the back surface of the other of the first pair of substrates is increased, the uniformity of the treatment can be further improved while the number of the substrates is maintained.

According to the present invention, at least one of the two holder constituting bodies pivots in the circumferential direction to change the positions of the two holder constituting bodies relative to each other in order that the columns surround the end portions of the substrates under the condition that the distance between any two of the columns is smaller than the diameters of the substrates. This prevents the substrates from sliding and falling out of the substrate holder.

According to the present invention, the vertical movement mechanism and the pivoting mechanism can be easily configured.

According to the present invention, each of the multi-plate units uses the support ring to hold the end portions of the two substrates under the condition that the back surfaces of the two substrates face each other. The substrate holder holds the plurality of multi-plate units at a vertical interval larger than the distance between the front surface of one of the two substrates held by the multi-plate unit and the back surface of the other of the two substrates. Therefore, the distance between the front surface of one of the two substrates held by the multi-plate unit and the back surface of the other of the two substrates is smaller than the distance between the front surface of the lower one of the two substrates held by the multi-plate unit and the back surface of the substrate located directly under the lower one of the two substrates. The number of the substrates held by the substrate holder can be increased while the uniformity of the treatment is ensured.

According to the present invention, each of the support rings is composed of the first and second support rings. Each of the first support rings holds the substrate under the condition the back surface of the substrate faces upward. Each of the second support rings holds the substrate under the condition the front surface of the substrate faces upward. Each of the support rings therefore holds the two substrates under the condition that the back surfaces of the two substrates face each other.

According to the present invention, each of the first and second support rings has protrusions that protrude from the circumference thereof and are arranged at an appropriate interval. The protrusions of the second support ring of each of the support rings are placed on the protrusions of the first support ring of the support ring. The protrusions of each of the second support rings have respective thicknesses that allow the distance between the substrate held by the first support ring and the substrate held by the second support ring to be maintained to a predetermined value. Each of the multi-plate units, therefore, has a simple structure capable of holding the two substrates under the condition that the back surfaces of the two substrates face each other.

According to the present invention, the substrate holder holds the substrates arranged at predetermined vertical intervals under the condition that the back surfaces of the substrates face upward, and each of the single-plate units uses the support ring to hold the end portion of the substrate under the condition that the front surface of the substrate faces upward. The substrate holder uses the support rings to hold the single-plate units under the condition that the back surface of each of the substrates held by the substrate holder faces the back surface of the substrate held by each of the single-plate units. The first distance between the front surface of one of the first pair of substrates that are vertically adjacent to each other and have the respective front surfaces facing each other and the back surface of the other of the first pair of substrates is larger than the distance between the front surface of one of the second pair of substrates that are vertically adjacent to each other and have the respective back surfaces facing each other and the back surface of the other of the second pair of substrates. The substrates do not stick to each other. The number of the substrates held by the substrate holder can therefore be increased compared with the conventional techniques while the uniformity of the treatment is ensured.

According to the present invention, the substrate holder has the plurality of columns surrounding the circumferences of the substrates to be treated. Each of the columns has the claws and the unit support sections. The claws hold the substrates. The unit support sections hold the single-plate units by means of the protrusions of the support rings. The substrate holder, therefore, has a simple structure capable of holding the substrates under the condition that the back surfaces of two substrates adjacent to each other face each other.

DESCRIPTION OF THE PREFERRED EMBODIMENTS

First Embodiment

Figure 1:
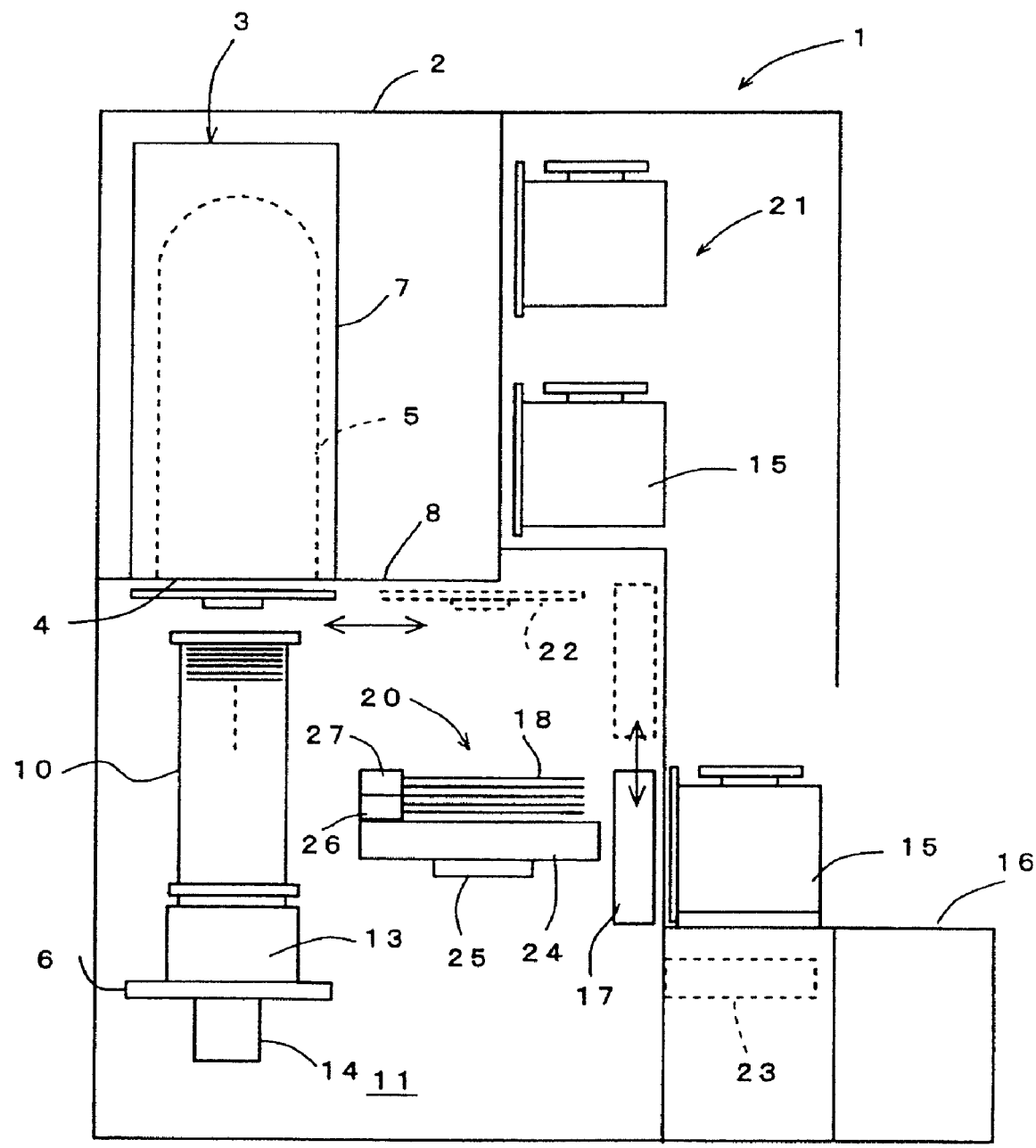
FIG. 1 is a vertical cross sectional view schematically showing a heat treatment apparatus according to a first embodiment of the present invention.

The best mode for carrying out the invention will be described below with reference to the accompanying drawings. FIG. 1 is a vertical cross sectional view schematically showing a heat treatment apparatus according to a first embodiment of the present invention. FIGS. 2(a) and 2(b) are respectively a plan view and a front view that schematically show an example of a substrate holder.

In FIG. 1, reference numeral 1 denotes a heat treatment apparatus. The heat treatment apparatus 1 has a housing 2 forming a framework. A vertical heat treating furnace 3 is provided inside and on the upper side of the housing 2. The vertical heat treating furnace 3 accommodates multiple substrates to be treated, e.g., semiconductor wafers w each having a thin circular shape. In the vertical heat treating furnace 3, a predetermined treatment such as chemical vapor deposition (CVD) is performed on the substrates. The heat treatment furnace 3 includes a reaction tube 5, a lid 6 and a heater (heating device) 7. The reaction tube 5 is a vertical treatment container and made of quartz. The reaction tube 5 has a furnace throat 4 at the bottom thereof. The furnace throat 4 has an opening. The lid 6 is capable of moving up and down to close and open the furnace throat 4 of the reaction tube 5. The heater 7 surrounds the circumference of the reaction tube 5 and is capable of controlling the temperature of the inside of the reaction tube 5 to increase the temperature to a predetermined temperature, e.g., a temperature ranging from 300° C. to 1200° C.

The reaction tube 5 and the heater 7 constitute the heat treatment furnace 3. A stainless steel (SUS) base plate 8 is horizontally oriented and mounts the reaction tube 5 and the heater 7. The base plate 8 is located in the housing 2 and has an opening (not shown) to insert the reaction tube 5 into the heat treating furnace 3 from the bottom side of the heat treatment furnace 3 toward the top side thereof.

The reaction tube 5 has an outward protruding flange at a bottom edge portion thereof. The flange is held by the base plate 8 by means of a flange support member. Accordingly, the reaction tube 5 is inserted into the opening of the base plate 8 from the bottom side of the heat treating furnace 3 toward the top side thereof and installed in the heat treating furnace 3. The reaction tube 5 is removable from the bottom side to clean the reaction tube 5. The reaction tube 5 is connected to a plurality of gas introduction tubes and a discharge tube. The gas introduction tubes introduce a process gas, an inert gas for purge, and the like into the reaction tube 5. The discharge tube has a vacuum pump, a pressure control valve, and the like, which are capable of controlling the pressure of a gas present in the reaction tube 5 to reduce the pressure. A cylindrical manifold may be connected to the bottom edge portion of the reaction tube 5. In this case, the manifold forms a furnace throat; the manifold has gas introduction ports and a discharge port; the introduction ports connect the gas introduction tubes and the reaction tube 5; and the discharge port connects the discharge tube and the reaction tube 5.

A loading area (operation area) 11 is provided under the base plate 8 that is located in the housing 2. In the loading area 11, wafers w are transferred and held by a boat (substrate holder) 10. The boat 10 is carried (loaded) into and carried (unloaded) out of the heat treating furnace 3 (i.e., the reaction tube 5). The boat 10 is provided on a thermal insulation tube 13 that is located above the lid 6. An elevation mechanism 12 (refer to FIG. 11(a)) is provided in the loading area 11. The elevation mechanism 12 lifts and lowers the lid 6 to carry the boat 10 into and out of the heat treating furnace 3.

The lid 6 is configured to come into contact with an edge of the furnace throat 4 and close the furnace throat 4. The thermal insulation tube 13 serves as furnace throat heat insulating means and prevents heat from being released from the furnace throat 4. The boat 10 is provided on the thermal insulation tube 13 that is located above the lid 6. A rotating table (not shown) is provided on the lid 6. The thermal insulation tube 13 is located on the rotating table. A boat rotating mechanism 14 is provided under the lid 6 and adapted to rotate the rotating table.

A load table (load port) 16 is provided on the front side of the housing 2. The load table 16 mounts a container 15 thereon to carry the container 15 into and out of the housing 2. The container 15 is capable of accommodating multiple wafers, e.g., 25 wafers at a predetermined interval. The container 15 has a removable lid (not shown) at the front thereof and is an encapsulated container (also called a hoop). A door mechanism 17 is provided on the front and back of the loading area 11. The door mechanism 17 allows the inside of the container 15 and the inside of the loading area 11 to communicate with each other. In this case, the lid of the container 15 is removed. A transfer mechanism 20 is provided in the loading area 11. The transfer mechanism 20 has a plurality of forks (transfer plates) 18 arranged at a predetermined vertical interval. The forks 18 are used to transfer the wafers w between the container 15 and the boat 10.

A storage shelf unit 21 and a carrying mechanism (not shown) are provided outside and above the front side of the loading area 11. The storage shelf unit 21 stores the container 15. The carrying mechanism is operable to carry the container 15 from the load table 16 to the storage shelf unit 21 or vice versa. A shutter mechanism 22 is provided above the loading area 11. The shutter mechanism 22 covers (or closes) the furnace throat 4 to suppress or prevent the release of a gas having a high temperature from the furnace throat 4 to the loading area 11 when the lid 6 is opened. An array device (aligner) 23 is provided under the load table 16. The array device 23 aligns a cutout portion (e.g., a notch) provided on the circumference of the wafer w (transferred by the transfer mechanism 20) in a single direction.

The transfer mechanism 20 has a plurality of the transfer plates (forks) 18 that hold respective horizontally-oriented wafers w arranged at a predetermined vertical interval. For example, five transfer plates 18 hold five wafers w. In this case, the fork placed at the center of the forks is capable of independently advancing toward and retreating from the front side of the heat treatment apparatus. A pitch changing mechanism is operable to lift and lower the other forks (the first, second, fourth and fifth forks) in a non-step manner in order to change the pitch of the forks on the basis of the central fork. The pitch changing mechanism allows multiple wafers to be simultaneously transferred between the container 15 and the boat 10 since the pitch of the wafers arranged in the container 15 may be different from the pitch of the wafers arranged in the boat 10.

The transfer mechanism 20 has a stage 24 capable of moving up and down and revolving. Specifically, the transfer mechanism 20 has an elevation arm capable of moving up and down by means of a ball screw or the like. The box-shaped stage 24 is capable of horizontally revolving and placed on the elevation arm 25. A first movable body 26 is provided on the stage 24. A second movable body 27 is provided on the first movable body 26. The first movable body 26 allows the central fork to move toward the front side of the heat treatment apparatus. The second movable body 27 allows the two forks located under the central fork and the two forks located above the central fork to move toward the front side of the heat treatment apparatus. The first and second movable bodies 26 and 27 can advance and retreat in the longitudinal direction of the horizontally-oriented stage 24.

A chucking mechanism may be provided at a base portion of each of the forks 18 of the transfer mechanism 20. The chucking mechanism is capable of gripping, from front and back sides of the fork 18 in the longitudinal direction of the fork 18, the wafer w at a region between the base portion of the fork 18 and a positioning groove located at an end portion of the fork 18. Each of the forks 18 of the transfer mechanism 20 may have a normal transfer mode and a special transfer mode and is selectively operated according to one of the modes. In the normal transfer mode, the fork 18 holds or grips the wafer w from the lower side of the wafer w to transfer the wafer w. In the special transfer mode, the fork 18 holds or grips the wafer w from the upper side of the wafer w to transfer the wafer w. A mapping sensor may be provided at the end portion of each of the forks 18. The mapping sensor detects the position of the wafer in the boat 10 or the position of the wafer in the container 15 to perform mapping.

Figure 2:
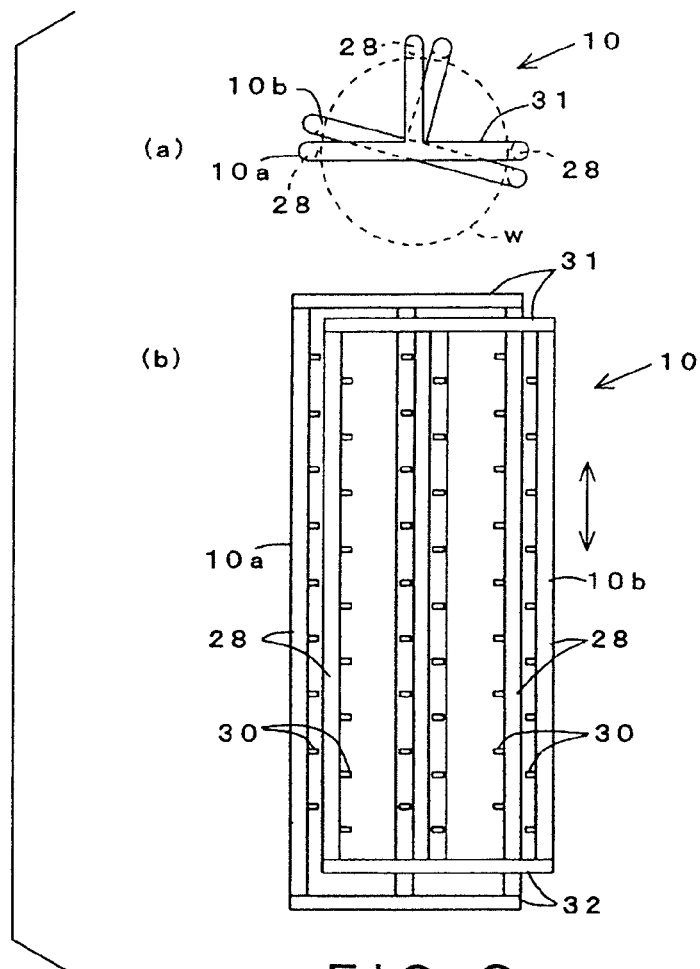
FIG. 2(a) is a plan view schematically showing an example of a substrate holder.
FIG. 2(b) is a front view showing the substrate holder.

The boat 10 is made of quartz, for example. The boat 10 is designed to hold horizontally-oriented wafers w that have large diameters, e.g., diameters of 300 mm and are arranged at predetermined vertical intervals (pitches). Specifically, the boat 10 has two boat constituting bodies (holder constituents) 10a and 10b as shown in FIGS. 2(*a*) and 2(*b*). Each of the boat constituting bodies 10a and 10b has a plurality of, e.g., three columns 28. Each of the columns 28 has claws (protrusions) 30 arranged at a predetermined vertical interval. Each of the claws 30 serves as a substrate holding section for holding the circumference (circumferential portion) of the wafer w. The claws 30 are arranged at a predetermined vertical interval. The columns 28 are arranged on the circumference of the same imaginary circle (or substantially the same imaginary circle). Each of the boat constituting bodies 10a and 10b is composed of a top member 31, a bottom member 32 and the three columns 28. Each of the top and bottom members 31 and 32 has a substantial T shape. The top member 31 is paired with the bottom member 32 and separated from the bottom member 32 in the vertical direction. The three columns 28 are fixed to respective end portions of the top member 31 and respective end portions of the bottom member 32. The wafers are carried into and out of the boat 10 from a large space (wafer transfer space) between two of the three columns 28. In this case, the large space between the two columns 28 is largest among spaces between any two of the three columns 28. The positions of the boat constituting bodies 10a and 10b can be changed relative to each other in the vertical direction (the difference between the vertical positions of the boat constituting bodies 10a and 10b can be changed) under the condition that the columns 28 of the boat constituting body 10a are close to the respective corresponding columns 28 of the boat constituting body 10b on the circumference of the same imaginary circle, as shown in FIGS. 2(*a*) and 2(*b*). In this case, it is preferable that the boat constituting body 10a be fixed and the boat constituting body 10b be movable, to simplify the structure of a vertical movement mechanism.

Figure 4:
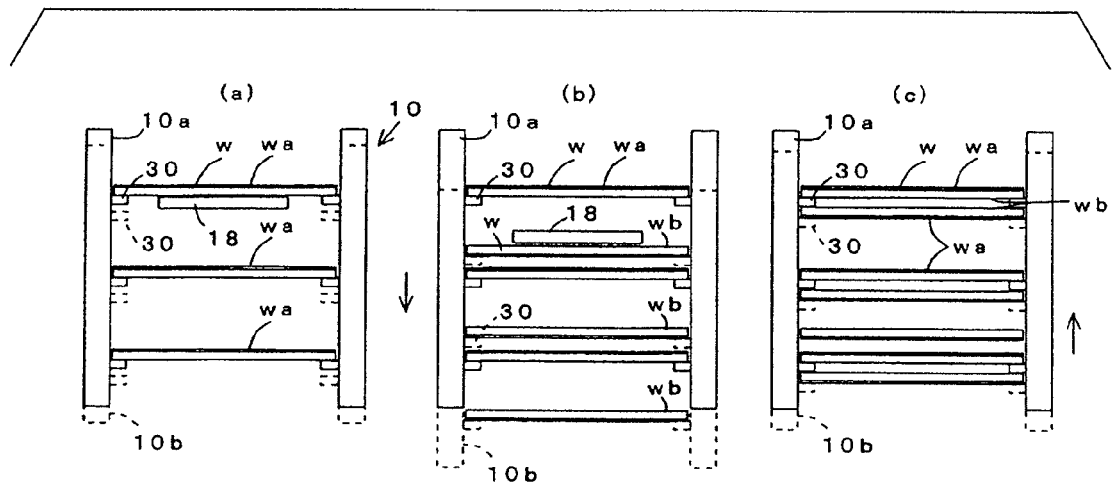
FIGS. 4(a) to 4(c) are diagrams each showing an action of the substrate holder.

The pitch of the claws 30 of the boat constituting body 10a is the same as the pitch of the claws 30 of the boat constituting body 10b. As shown in FIGS. 4(*a*) to 6, the wafers with the front surfaces facing upward is held by the boat constituting body 10a, while the wafers with the back surfaces facing downward is held by the boat constituting body 10b. The wafer with the front surface facing upward and the wafer with the back surface facing upward are alternately arranged in the vertical direction. The positions of the boat constituting bodies 10a and 10b can be changed relative to each other in the vertical direction under the condition that a distance pa between the front surface of one of a first pair of wafers that are vertically adjacent to each other and have the respective front surfaces facing each other and the back surface of the other of the first pair of wafers is set to ensure uniformity of the treatment and larger than a distance pb between the front surface of one of a second pair of wafers that are vertically adjacent to each other and have the respective back surfaces facing each other and the back surface of the other of the second pair of wafers. In this case, it is preferable that the boat constituting body 10a be larger than (longer in the vertical direction than) the boat constituting body 10b for an operation of moving at least one of the boat constituting bodies 10a and 10b to change the vertical positions of the boat constituting bodies 10a and 10b relative to each other (FIG. 2(*b*)). In this case, the distance pa is between one of the first pair of wafers and the other of the first pair of wafers, while the distance pb is between one of the second pair of wafers and the other of the second pair of wafers.

Figure 5:
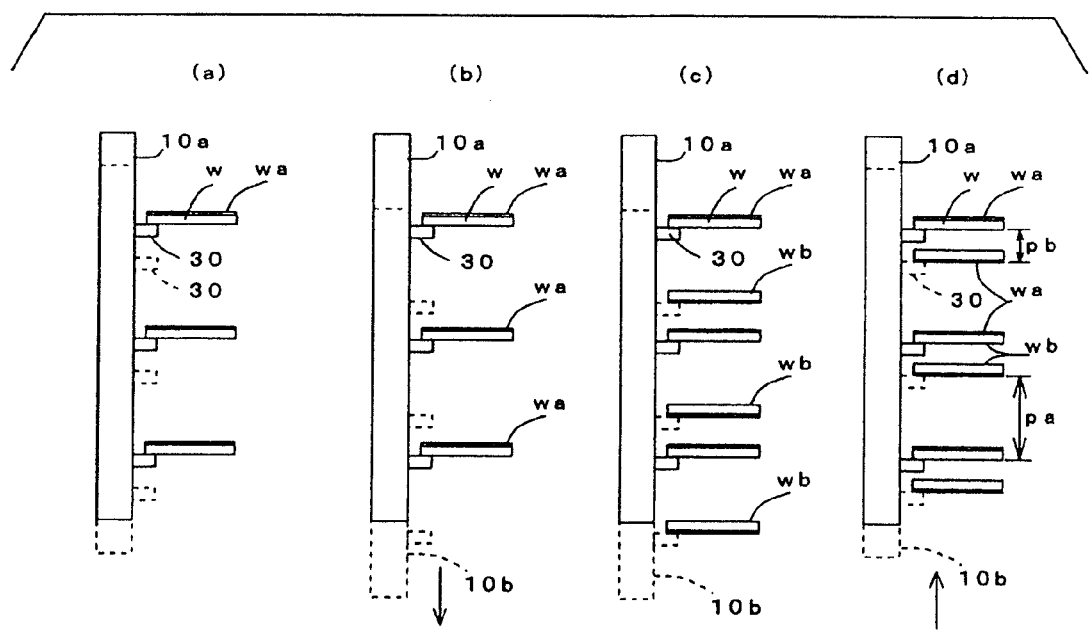
FIGS. 5(a) to 5(d) are diagrams each showing an action of the substrate holder.

In FIGS. 4(*a*) to 5(*d*), the boat constituting bodies 10a and 10b are set such that each distance between the claw 30 of the boat constituting body 10a and the claw 30 (located directly under the claw 30 of the boat constituting body 10a) of the boat constituting body 10b is set to be small in advance. As shown in FIGS. 4(*a*) and 5(*a*), a wafer is first transferred onto the claws 30 of the boat constituting body 10a under the condition that the wafer with the front surface wa facing upward is held or gripped by the fork 18 from the lower side of the wafer. Next, the boat constituting body 10b moves down as shown in FIG. 5(*b*). Then, a wafer is transferred onto the claws 30 of the boat constituting bodies 10b under the condition that wafer with the back surface wb facing upward is gripped by the fork 18 from the upper side of the wafer, as shown in FIGS. 4(b) and 5(c). The boat constituting body 10b moves up to returns to the original position as shown in FIG. 4(c) and FIG. 5(d). Therefore, the distance pa is set such that the uniformity of the treatment is ensured, and the distance pb is smaller than the distance pa.

Figure 6:
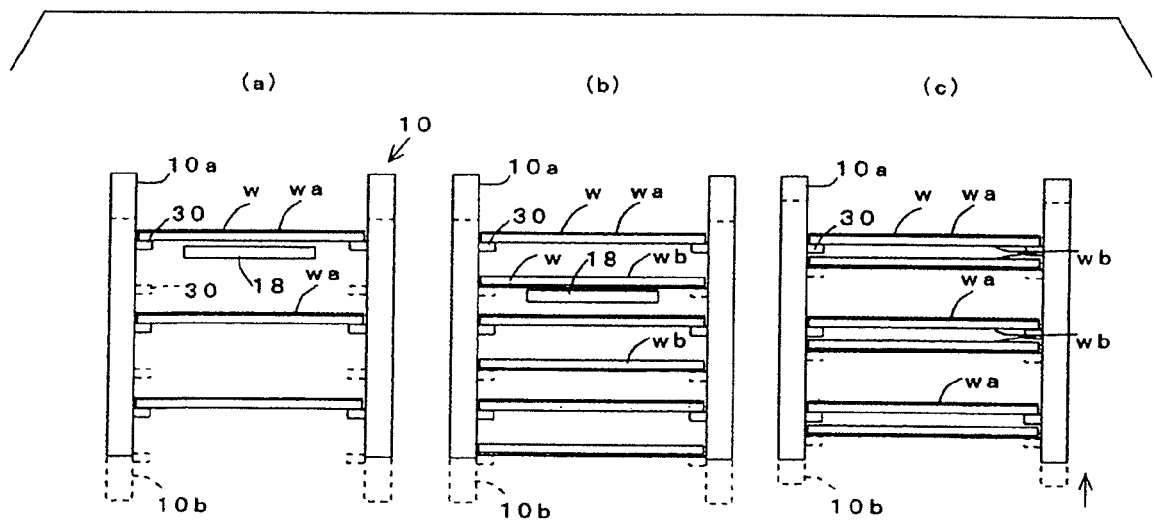
FIGS. 6(a) to 6(c) are diagrams each showing an action of the substrate holder.

In FIGS. 6(a) to 6(c), the boat constituting bodies 10a and 10b are set such that a distance between one of the claws 30 of the boat constituting body 10a and the claw 30 (located directly under the one of the claws 30 of the boat constituting body 10a) of the boat constituting body 10b is set to be equal to a distance between another one of the claws 30 of the boat constituting body 10a and the claw 30 (located directly under the other of the claws 30 of the boat constituting body 10a) of the boat constituting body 10b. As shown in FIG. 6(a), a wafer is first transferred onto the claws 30 of the boat constituting body 10a under the condition that the wafer with the front surface wa facing upward is held or gripped by the fork 18 from the lower side of the wafer. Next, a wafer is transferred onto the claws 30 of the boat constituting body 10b under the condition that the wafer with the back surface wb facing upward is held or gripped by the fork 18 from the lower side of the wafer, as shown in FIG. 6(b). Then, the boat constituting body 10a moves up as shown in FIG. 6(c) such that the claws 30 of the boat constituting body 10b are close to back surfaces of the claws 30 of the boat constituting body 10a. Therefore, the distance pa is set to ensure the uniformity of the treatment, and the distance pb is smaller than the distance pa.

Figure 3:
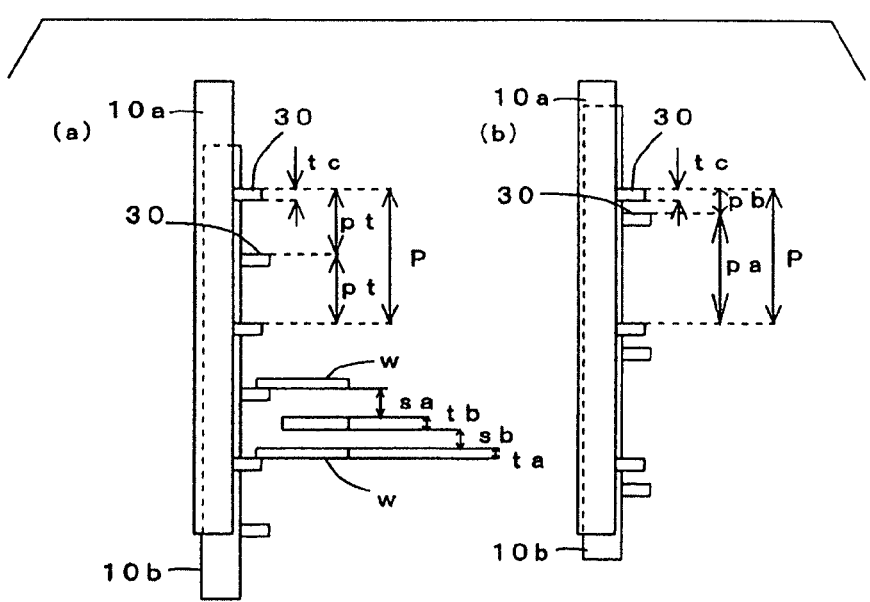
FIGS. 3(a) and 3(b) are diagrams each showing an action of the substrate holder.

In this case, the total of the thickness ta of the wafer, the thickness tb of the fork, and clearances sa and sb for placement is equal to a placement pitch pt (of the wafers), as shown in FIG. 3(a). The placement pitch pt is equal to a half of a boat pitch P (equal to the pitch of the claws of one of the boat constituting bodies). The distance pb is slightly larger than the sum of the thickness tc of the claw and the thickness ta of the wafer w. The distance pa is equal to a value obtained by subtracting the distance pb from the boat pitch P. Compared with an existing system (having 8 placement pitches and 61 slots), when the placement pitch pt is 7 mm, the number of slots is 7×70. This results in the fact that nine wafers can be added. When the placement pitch pt is 5.6 mm, the number of slots is 5.6×87. This results in the fact that twenty six wafers (that can be accommodated in one container) can be added. A vertical movement mechanism 33 (described later) is capable of changing the positions of the boat constituting bodies 10a and 10b relative to each other to change the distance pa. The pitch pa can be in the range from approximately 0 mm (e.g., the thicknesses of the claws are approximately 2 mm) to more than 10 mm (e.g., to approximately 11 mm). The distance pb can be also changed in the same manner.

Figure 8:
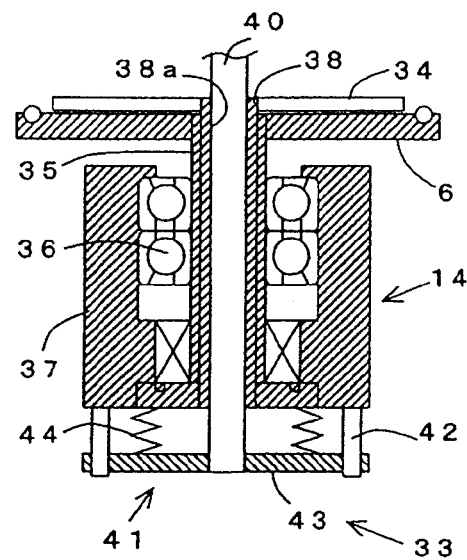
FIG. 8 is a cross sectional view schematically showing an example of a vertical movement mechanism.

The positions of the boat constituting bodies 10a and 10b can be changed relative to each other in the vertical direction by means of the vertical movement mechanism 33. In the present embodiment, the boat constituting body 10a is fixed to and placed on a rotating table 34 (refer to FIG. 8) that is provided on the lid 6, and the boat constituting body 10b is moved up and down by the vertical movement mechanism 33. The vertical movement mechanism 33 is attached to the boat rotating mechanism 14 that is provided under the lid 6.

The boat rotating mechanism 14 has a cylindrical sleeve 35, a rotating body 37, a hollow rotating shaft 38 and a motor (not shown). The sleeve 35 is fixed to a central axis portion of the lid 6. The rotating body 37 is provided around the circumference of the sleeve 35 via a ball bearing 36. The rotating body 37 is rotatable. The rotating shaft 38 is fixed to a lower central portion of the rotating body 37. In addition, the rotating shaft 38 extends in the sleeve 35 and through the upper surface of the lid 6, and is coupled with the rotating table 34 that is provided on the lid 6. The motor drives the rotating body 37 by means of an endless belt wound around the circumference of the rotating body 37 to cause the rotating body 37 to rotate.

The vertical movement mechanism 33 has an elevation shaft (vertical movement shaft) 40 and an elevation drive section 41. The elevation shaft 40 extends through the rotating shaft 38 of the rotating mechanism 14 and is capable of moving up and down. The elevation drive section 41 causes the elevation shaft 40 to move up and down. The vertical movement mechanism 33 also has a disk-shaped vertically movable body 43 that is provided under the rotating body 37 and held by a guide 42. The vertically movable body 43 is capable of moving up and down. The elevation shaft 40 is erected on a central portion of the vertically movable body 43. In addition, the elevation shaft 40 extends through a hollow portion (shaft hole) 38a of the rotating shaft 38 and projects out of the upper surface of the lid 6. The elevation drive section 41 may be an air cylinder. A bellows 44 is preferably provided between the rotating body 37 and the vertically movable body 43 to maintain air-tightness of a through-hole section of the elevation shaft 40. The elevation shaft 40 also extends through the rotating table 34 and the thermal insulation tube 13 and is coupled with the bottom member 32 (not shown in FIG. 8) of the boat constituting body 10b.

According to the heat treatment method and the heat treatment apparatus as described above, the boat 10 is composed of the two holder constituents 10a and 10b. Each of the holder constituents has the plurality of columns arranged on the circumference of the same imaginary circle. Each of the columns has the claws 30 arranged at a predetermined vertical interval. Each of the claws holds the edge portion of the wafer. The boat constituting body 10a holds the wafers w with the front surfaces wa facing upward, while the boat constituting body 10b holds the wafers w with the back surfaces facing upward. After the wafers are held by the boat constituting bodies 10a and 10b, at least one of the two holder constituents 10a and 10b moves in the vertical direction to change the positions of the two holder constituents 10a and 10b relative to each other. Accordingly, the wafer with the front surface facing upward and the wafer with the back surface facing upward are alternately arranged in the vertical direction. Therefore, the distance pa is set to ensure the uniformity of the treatment, and the distance pb is smaller than the distance pa. This makes it possible that the number of wafers to be held by the boat 10 is increased compared with the conventional techniques while the uniformity of the treatment is ensured, and the throughput can be improved. Even when the distance pa is increased and the number of wafers to be held by the substrate holder is the same as that of wafers in the conventional techniques, it is possible to improve the uniformity of the treatment while the number of wafers to be held by the substrate holder is maintained.

Figure 7:
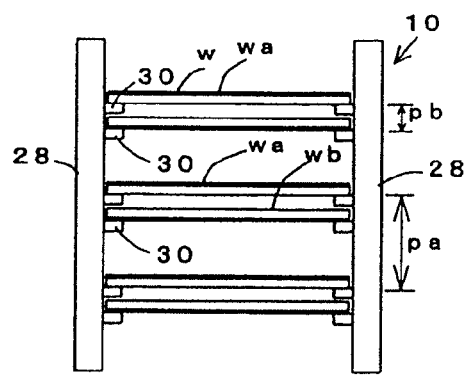
FIG. 7 is a front view schematically showing another example of the substrate holder.

FIG. 7 is a front view schematically showing another example of the boat. The boat shown in FIG. 7 is different from the boat described above. The boat shown in FIG. 7 is not composed of the two boat constituting bodies and has a plurality of, for example, three columns 28. Each of the columns 28 has claws 30 on which wafers are placed. In the boat shown in FIG. 7, the wafer with the front surface facing upward and the wafer with the back surface facing upward are alternately arranged in the vertical direction. The distance pa is set to ensure the uniformity of the treatment, while the distance pb is smaller than the distance pa. According to the present embodiment, it is possible to ensure uniformity of the treatment with a simple structure of the substrate holder and increase the number of wafers to be held by the substrate holder compared with conventional techniques. Even when the distance pa is increased and the number of wafers to be held by the substrate holder is the same as that of wafers in the conventional techniques, it is possible to improve the uniformity of the treatment while the number of wafers to be held by the substrate holder is maintained.

Figure 10:
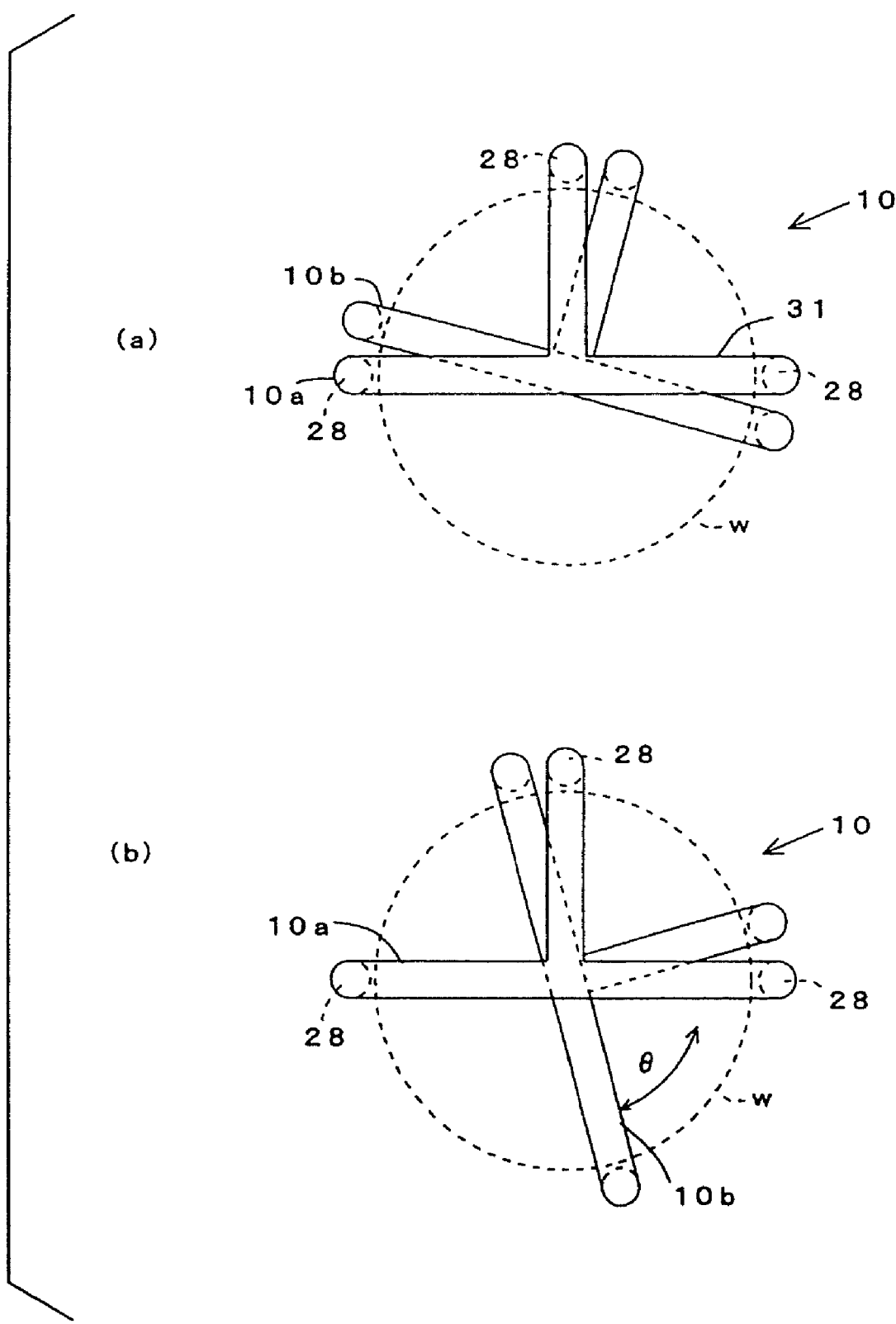
FIGS. 10(a) and 10(b) are plan views each schematically showing another example of the substrate holder.

FIG. 10 is a plan view schematically showing another example of the substrate holder. In the boat 10 according to the present embodiment, at least one of the boat constituting bodies 10a and 10b is pivoted in the circumferential direction by a pivoting mechanism 45 (described later) to change the positions relative to each other in order that the columns 28 surround the end portions of the wafers under the condition that the distances between any two of the columns 28 is smaller than the diameters of the wafers. This configuration of the boat 10 prevents the wafers from sliding and falling out of the boat 10. In this case, it is preferable that the boat constituting body 10b be pivoted by a predetermined angle θ (e.g., θ=60 to 90 degrees) with respect to the boat constituting body 10a to change the positions of the boat constituting body 10a and 10b relative to each other.

Figure 9:
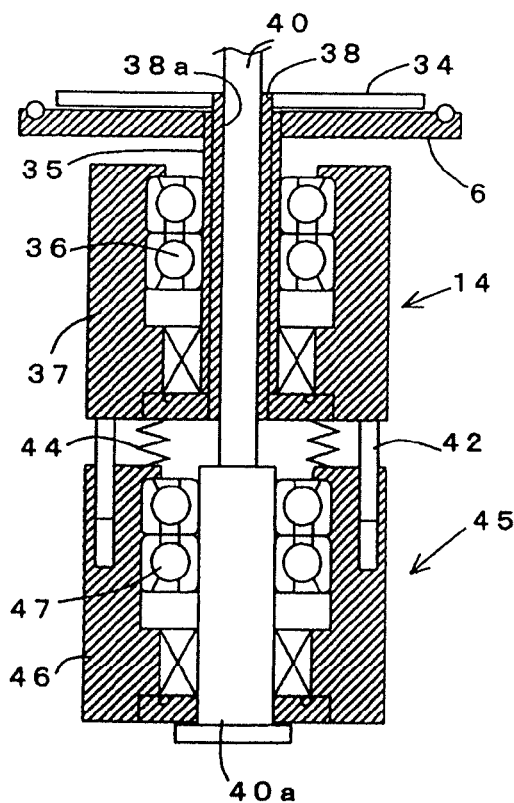
FIG. 9 is a cross sectional view schematically showing another example of the vertical movement mechanism.

The pivoting mechanism 45 has a configuration shown in FIG. 9, for example. The elevation shaft 40 (refer to FIG. 8) is rotatable independently of the rotating shaft 38. A second rotating body 46 is therefore provided under the rotating body 37 of the rotating mechanism 14 and held by the guide 42 and the bellows 44. The second rotating body 46 is capable of moving up and down. The elevation shaft 40 has a rotatable base portion 40a provided in the second rotating body 46. The base portion 40a is held by a ball bearing 47. A motor (not shown) is provided under the second rotating body 46 and causes the elevation shaft 40 to rotate. The elevation drive section, such as an air cylinder, causes the elevation shaft 40 and the second rotating body 46 to move up and down. Accordingly, the elevation shaft 40 is capable of not only moving up and down but also pivoting. The pivoting of the elevation shaft 40 allows the boat constituting body 10b to pivot to change the position of the boat constituting body 10b relative to the position of the boat constituting body 10a.

Figure 11:
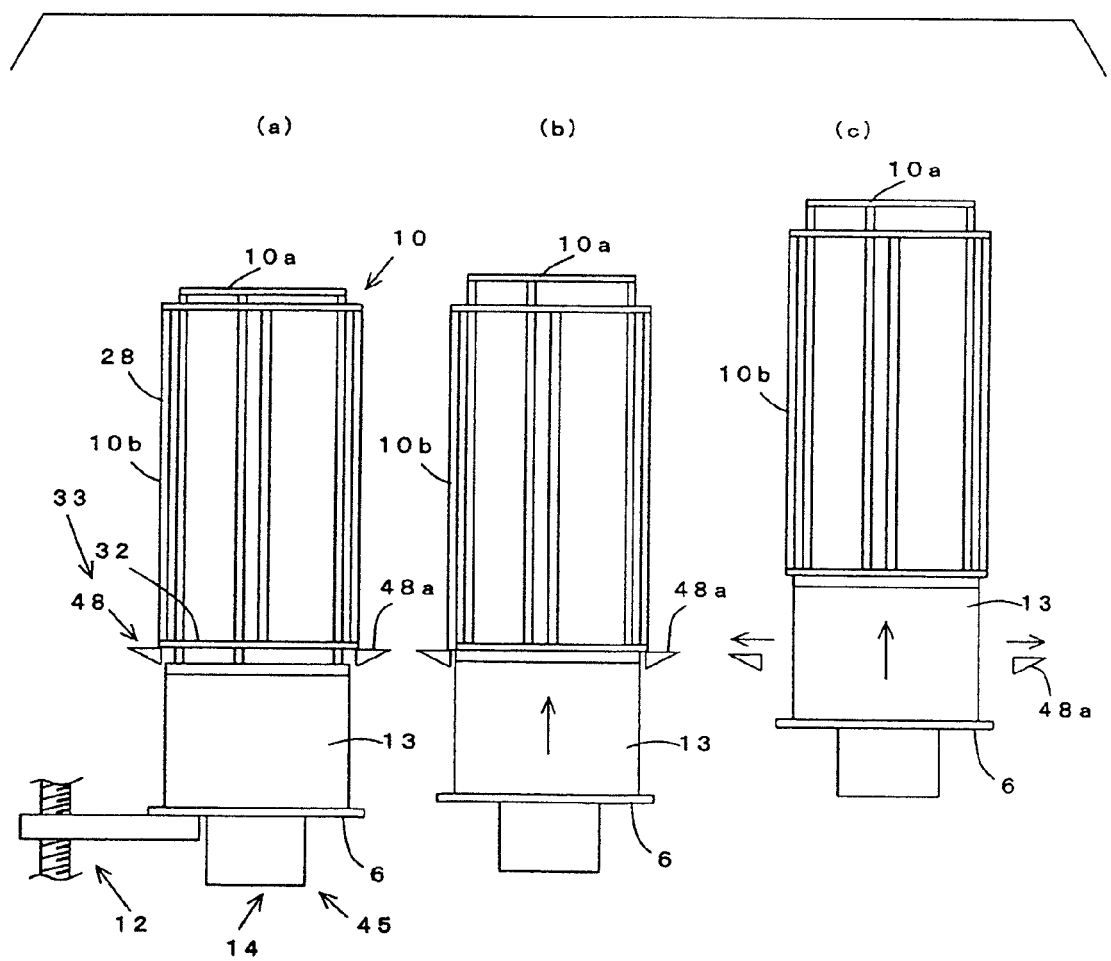
FIGS. 11(a) to 11(c) are diagrams each schematically showing another example of the substrate holder.
Figure 12:
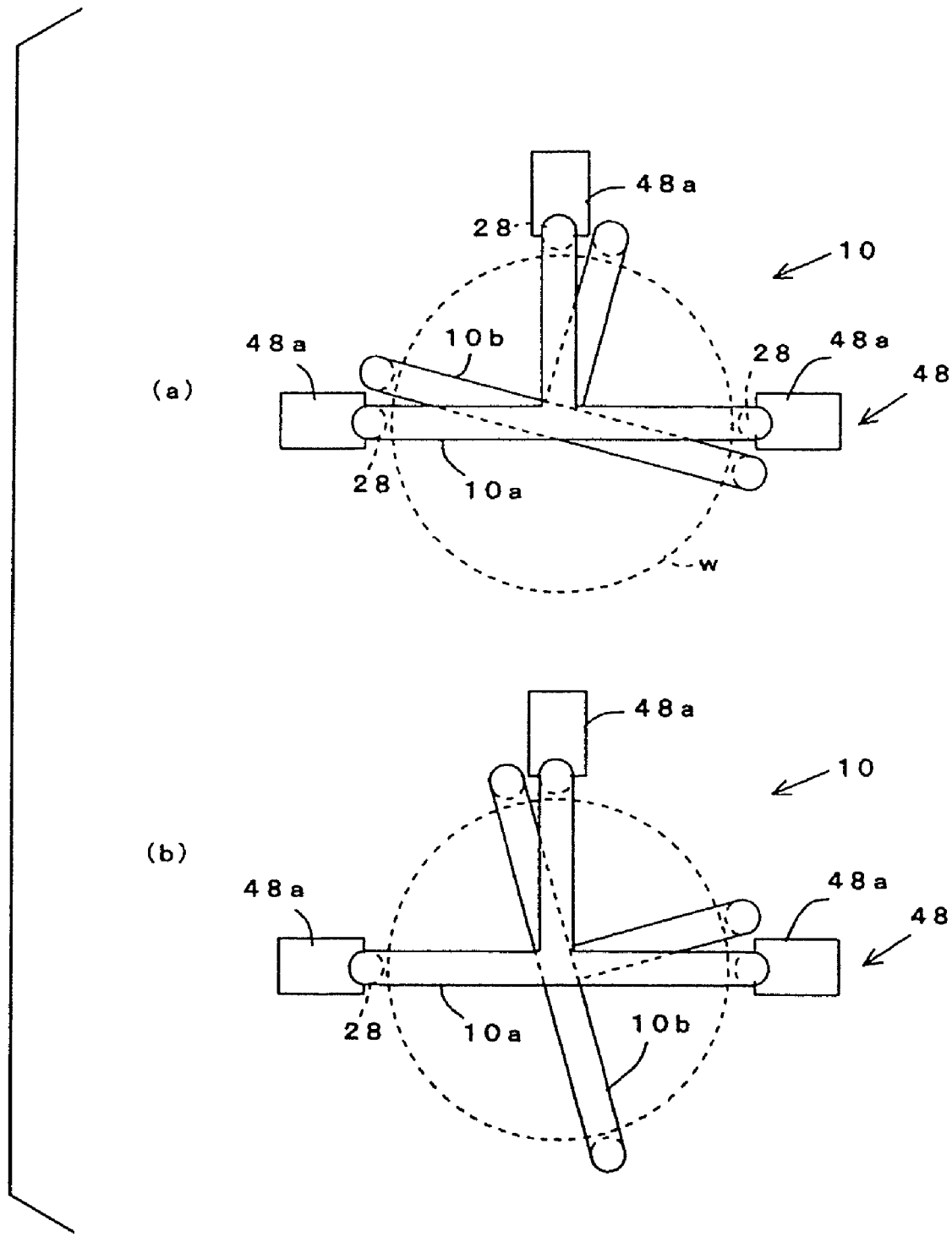
FIGS. 12(a) and 12(b) are plan views each schematically showing the substrate holder shown in FIGS. 11(a) to 11(c).

FIGS. 11(a)-11(c) are diagrams schematically showing another example of the substrate holder. FIGS. 12(a) and 12(b) are plan views schematically showing the substrate holder shown in FIG. 11(a)-11(c). In the present embodiment, the vertical movement mechanism 33 causes the boat constituting body 10b to move relative to the boat constituting body 10a. The vertical movement mechanism 33 has the elevation mechanism 12 and a latch mechanism 48. The elevation mechanism 12 is designed to move up and down the boat 10 to carry the boat 10 into and out of the heat treating furnace. The boat 10 is located on the thermal insulation tube 13 present above the lid 6 (for closing the furnace throat of the heat treating furnace). The latch mechanism 48 is designed to latch the boat constituting body 10b before the boat reaches its stop position when the boat is carried out of the heat treating furnace by the elevation mechanism 12 and restore the relationship between the vertical positions of the holder constituting body 10a and 10b relative to each other.

In this case, the pivoting mechanism 45 for pivoting the boat constituting body 10b relative to the boat constituting body 10a is provided with the latch mechanism 48 and the boat rotating mechanism 14. The boat rotating mechanism 14 pivots the boat constituting body 10a by a predetermined angle relative to the boat constituting body 10b in the circumferential direction to change the position of the boat constituting body 10a relative to the position of the boat constituting body 10b latched by the latch mechanism 48.

The latch mechanism 48 has a plurality of, e.g., three latch members 48a and an advance/retreat drive section (not shown). The latch members 48a latch (hold) the lower surface of the boat constituting body 10a, e.g., each end portion (corresponding to a lower end portion of each column 28) of the bottom member 32. The advance/retreat drive section moves the latch members 48 outward with respect to the boat 10 in the radial direction of the boat 10 and moves the latch members 48a inward with respect to the boat 10 in the radial direction of the boat 10 to avoid interference with lid 6 during the vertical movement of the lid 6. The advance/retreat drive section may be an air cylinder.

The wafers are carried into the boat 10 in the state shown in FIGS. 11(a) and 12(a). In this case, the boat constituting bodies 10a and 10b are in the state in which the columns 28 of the boat constituting body 10a are respectively close to the corresponding columns 28 of the boat constituting body 10b and in which the boat constituting body 10b is latched by the latch members 48 at a position higher than the position of the boat constituting body 10a. After the wafers are held by the boat 10, the boat constituting body 10a is in the state shown in FIG. 11(a). The boat constituting body 10a is then rotated by the predetermined angle θ by the boat rotating mechanism 14. Then, distances between any two of the columns 28 of the boat constituting bodies 10a and 10b are set to be smaller than the diameters of the wafers in order that the columns 28 surround the end portions of the wafers. This prevents the wafers from sliding and falling out of the boat during the carrying of the wafers into and out of the boat and during the heat treatment.

Next, after the elevation mechanism 12 lifts the lid 6 to carry the boat 10 into the heat treating furnace, the furnace throat of the heat treating furnace is closed by means of the lid 6. In the process of lifting the lid 6, the boat constituting body 10a is first moved to a position higher by a predetermined distance than the boat constituting body 10b (the positions of the boat constituting bodies 10a and 10b are changed relative to each other). The state (in which the distance between the front surface of one of the first pair of wafers that are vertically adjacent to each other and have the respective front surfaces facing each other and the back surface of the other of the first pair of wafers is larger than the distance between the front surface of one of the second pair of wafers that are vertically adjacent to each other and have the respective back surfaces facing each other and the back surface of the other of the second pair of wafers) shown in FIGS. 4(c) and 6(c) is then obtained. In the process of lifting the lid 6, the latch members 48a of the latch mechanism 48 are moved (retreated) outward with respect to the boat 10 in the radial direction of the boat 10 to avoid interference with the lid 6, as shown in FIG. 11(c). In order to carry the boat 10 out of the heat treating furnace, the operations shown in FIGS. 11(a) to 11(c) are performed in the opposite order, that is, in the order of the operation shown in FIG. 11C, the operation shown in FIG. 11B, and the operation shown in FIG. 11A. The substrate holder shown in FIGS. 11A to 11C can obtain a similar effect to the other example of the substrate holder.

Although the first embodiment of the present invention is described above with reference to the drawings, the heat treatment method and the heat treatment apparatus are not limited to first embodiment and may be modified without departing from the scope and sprit of the present invention.

Second Embodiment

Figure 13:
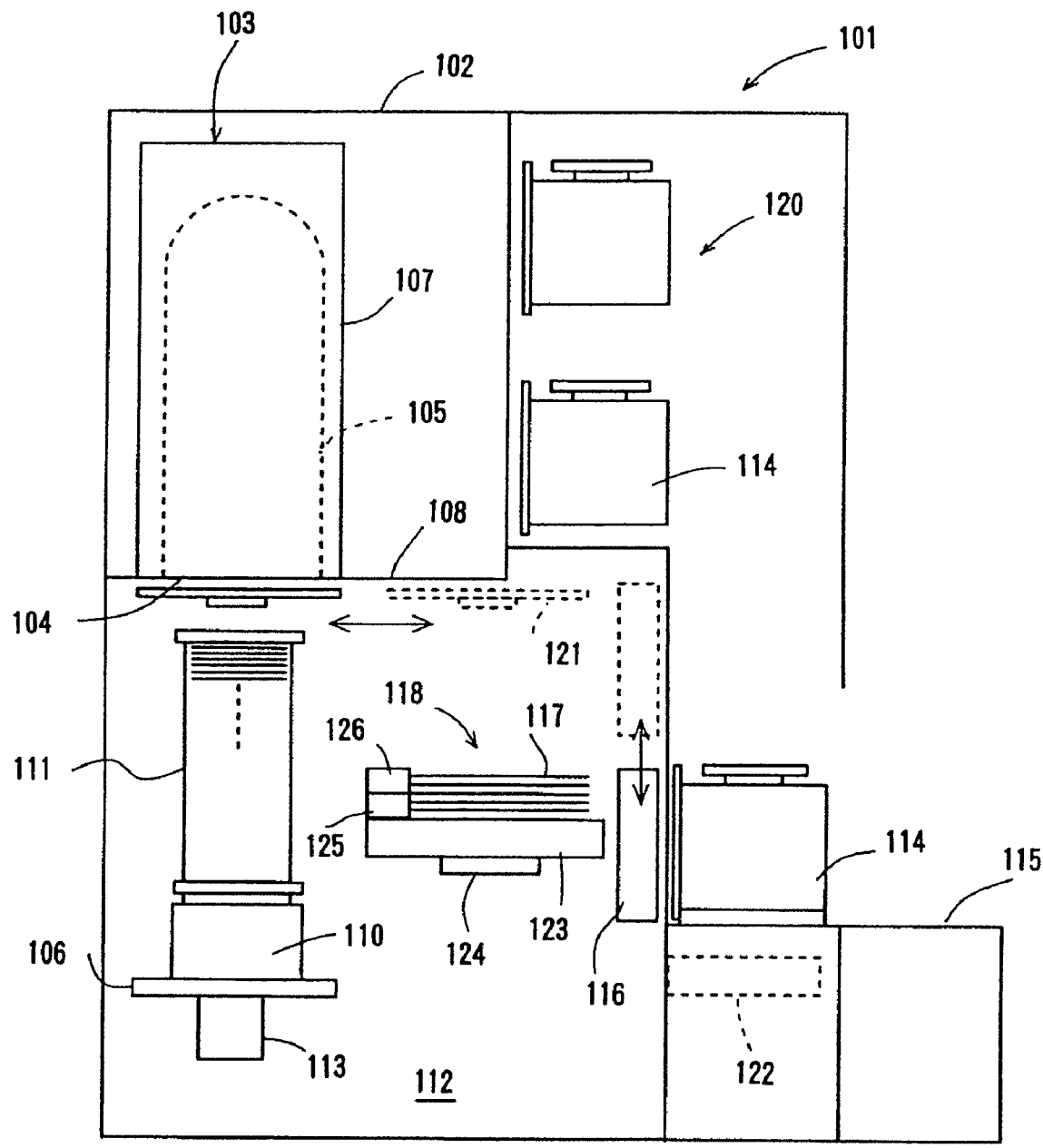
FIG. 13 is a vertical cross sectional view showing a heat treatment apparatus according to a second embodiment of the present invention.

The best mode for carrying out the invention will be described below with reference to the accompanying drawings. FIG. 13 is a vertical cross sectional view schematically showing a heat treatment apparatus according to a second embodiment of the present invention. FIGS. 14(a) to 14(d) are diagrams schematically showing an example in which two wafers are held by means of a support ring under the condition that the back surfaces of the adjacent wafers face each other. FIG. 15 is a front view schematically showing a boat in which pairs of wafers held by means of the support rings are hold at predetermined vertical intervals. FIG. 16(a) is a perspective view schematically showing the support ring, and FIG. 16(b) is an enlarged perspective view showing a main portion of the support ring.

In FIG. 13, reference numeral 101 denotes the vertical heat treatment apparatus. The heat treatment apparatus 101 has a housing 102 forming a framework. A heat treatment furnace 103 is provided inside and on the upper side of the housing 102. The heat treatment furnace 103 accommodates a plurality of substrates to be treated, e.g., thin circular semiconductor wafers w. In the heat treatment furnace 103, a predetermined treatment such as chemical vapor deposition (CVD) is performed on the substrates. The heat treatment furnace 103 is mainly composed of a reaction tube 105, a lid 106 and a heater (heating device) 107. The reaction tube 105 is a vertical treatment container and made of quartz. The reaction tube 105 has a furnace throat 104 at the bottom thereof. The furnace throat 104 has an opening. The lid 106 is capable of moving up and down to close and open the furnace throat 104 of the reaction tube 105. The heater 107 surrounds the circumference of the reaction tube 105 and is capable of controlling the temperature of the inside of the reaction tube 105 to increase the temperature to a predetermined temperature, e.g., a temperature ranging from 300° C. to 1200° C.

The reaction tube 105 and the heater 107 constitute the heat treatment furnace 103. A stainless steel (SUS) base plate 108 is horizontally oriented and mounts the reaction tube 105 and the heater 107. The base plate 108 is located in the housing 102 and has an opening (not shown) to insert the reaction tube 105 into the heat treating furnace 103 from the bottom side of the heat treatment furnace 103 to the top side thereof.

The reaction tube 105 has an outward protruding flange at a bottom edge portion thereof. The flange is held by the base plate 108 by means of a flange support member. Accordingly, the reaction tube 105 is inserted into the opening of the base plate 108 from the bottom side of the heat treating furnace 103 to the top side and installed in the heat treating furnace 103. The reaction tube 105 is removable from the base plate 108 downwardly to be cleaned. The reaction tube 105 is connected to a plurality of gas introduction tubes and a discharge tube. The gas introduction tubes introduce a process gas, an inert gas for purge, and the like into the reaction tube 105. The discharge tube has a vacuum pump, a pressure control valve, and the like, which are capable of controlling the pressure of a gas present in the reaction tube 105 to be reduced. A cylindrical manifold may be connected to the bottom edge portion of the reaction tube 105. In this case, the manifold forms a furnace throat; the manifold has gas introduction ports and a discharge port; the introduction ports connect the gas introduction tubes and the reaction tube 105; and the discharge port connects the discharge tube and the reaction tube 105.

A loading area (operation area) 112 is provided under the base plate 108 that is located in the housing 102. In the loading area 112, a boat (substrate holder) 111 is carried (loaded) into and carried (unloaded) out of the heat treating furnace 103 (i.e., the reaction tube 105); and wafers w are held by the boat 111. The boat 111 is provided on a thermal insulation tube 110 that serves as furnace throat heat insulating means and is located above the lid 106. An elevation mechanism (not shown) is provided in the loading area 112. The elevation mechanism causes the lid 106 to move up and down to carry the boat 111 into and out of the heat treating furnace 103.

The lid 106 is configured to come into contact with an edge of the furnace throat 104 and close the furnace throat 104. A rotating mechanism 113 is attached to a lower portion of the lid 106 and rotates the boat 111. The rotating mechanism 113 has a rotating shaft extending through the lid 106 in an airtight manner. The rotating shaft of the rotating mechanism 113 rotates a rotating table (not shown) or a support leg 130 (shown in FIG. 22). The rotating table is provided on the lid 106. The support leg 130 is provided at a central bottom portion of the boat 111.

A load table (load port) 115 is provided on the front side of the housing 102. The load table 115 mounts a container 114 thereon to carry the container 114 into and out of the housing 102. The container 114 is capable of accommodating multiple wafers, e.g., 25 wafers at a predetermined interval. The container 114 has a removable lid (not shown) at the front thereof and is an encapsulated container (also called a hoop). A door mechanism 116 is provided on the front and back of the loading area 112. The door mechanism 116 allows the inside of the container 114 and the inside of the loading area 112 to communicate with each other. In this case, the lid of the container 114 is removed. A transfer mechanism 118 is provided in the loading area 112. The transfer mechanism 118 has a plurality of horizontally-oriented forks (transfer plates) 117 arranged at a predetermined vertical interval. The forks 117 are used to transfer the wafers w between the container 114 and the boat 111.

A storage shelf unit 120 and a carrying mechanism (not shown) are provided outside and above the front side of the loading area 112. The storage shelf unit 120 stores the container 114. The carrying mechanism is operable to carry the container 114 from the load table 115 to the storage shelf unit 120 or vice versa. A shutter mechanism 121 is provided above the loading area 112. The shutter mechanism 121 covers (or closes) the furnace throat 104 to suppress or prevent the release of a gas having a high temperature from the furnace throat 104 to the loading area 112 when the lid 106 is opened. An array device (aligner) 122 is provided under the load table 115. The array device 122 aligns a cutout portion (e.g., a notch) provided on the circumference of the wafer w (transferred by the transfer mechanism 118) in a single direction.

The fork 117 placed at the center of the forks 117 is capable of advancing toward and retreating from the front side of the heat treatment apparatus. A pitch changing mechanism is operable to lift and lower the other forks (the first, second, fourth and fifth forks) in a non-step manner in order to change the pitch of the forks on the basis of the central fork. The pitch changing mechanism allows multiple wafers to be simultaneously transferred between the container 114 and the boat 111 since the pitch of the wafers arranged in the container 114 may be different from the pitch of the wafers arranged in the boat 111.

The transfer mechanism 118 has a stage 123 capable of moving up and down and revolving. Specifically, the transfer mechanism 118 has an elevation arm 124 capable of moving up and down by means of a ball screw or the like. The box-shaped stage 123 is capable of horizontally revolving and placed on the elevation arm 124. A first movable body 125 is provided on the stage 123. A second movable body 126 is provided on the first movable body 125. The first movable body 125 allows the central fork to move in the longitudinal direction of the stage 123. The second movable body 126 allows the two forks located under the central fork and the two forks located above the central fork to move.

A chucking mechanism may be provided at a base portion of each of the forks 117 of the transfer mechanism 118. The chucking mechanism is capable of gripping, from front and back sides of the fork 117 in the longitudinal direction of the fork 117, the wafer w at a region between the base portion of the fork 117 and a positioning groove located at an end portion of the fork 117. Each of the forks 117 of the transfer mechanism 118 may have a normal transfer mode and a special transfer mode and is selectively operated according to one of the modes. In the normal transfer mode, the fork 117 holds or grips the wafer w from the lower side of the wafer w to transfer the wafer w. In the special transfer mode, the fork 117 holds or grips the wafer w from the upper side of the wafer w to transfer the wafer w. A mapping sensor may be provided at the end portion of each of the forks 117. The mapping sensor detects the position of the wafer in the boat 111 or the position of the wafer in the container 114 to perform mapping.

Figure 22:
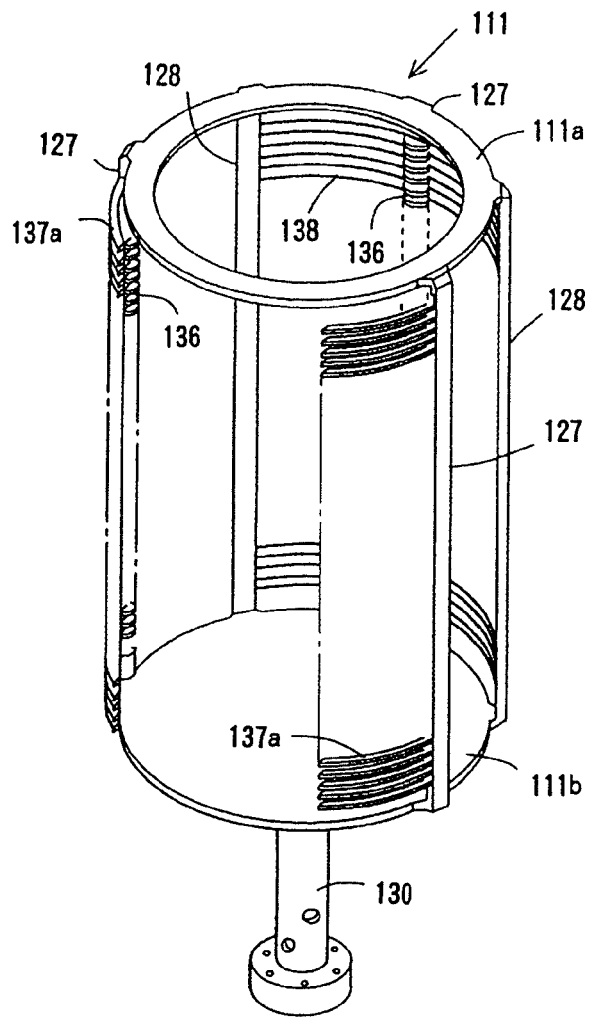
FIG. 22 is a perspective view schematically showing an example of the boat.

The boat 111 is made of quartz, for example. The boat 111 is designed to hold horizontally-oriented wafers w that have large diameters, e.g., diameters of 300 mm and are arranged at predetermined vertical intervals (pitches). As shown in FIG. 22, the boat 111 has a top plate 111a, a bottom plate 111b and a plurality of, e.g., three columns 127. The columns 127 are provided between the top plate 111a and the bottom plate 111b. An auxiliary column 128 may be provided if necessary, in addition to the columns 127. The boat 111 has the support leg 130 provided at the central bottom portion of the boat 111. The support leg 130 is coupled with the rotating shaft of the rotating mechanism 113 attached to the lower portion of the lid 106. In the case where the boat 111 is used, a heat shield member (not shown) is provided between the lid 106 and the bottom plate 111b in place of the thermal insulation tube. The boat 111 may not have the support leg and may have a thermal insulation tube provided under the boat 111 (refer to FIG. 13). In this case, the thermal insulation tube is located on the rotating table that is present on the lid 106.

Figure 14:
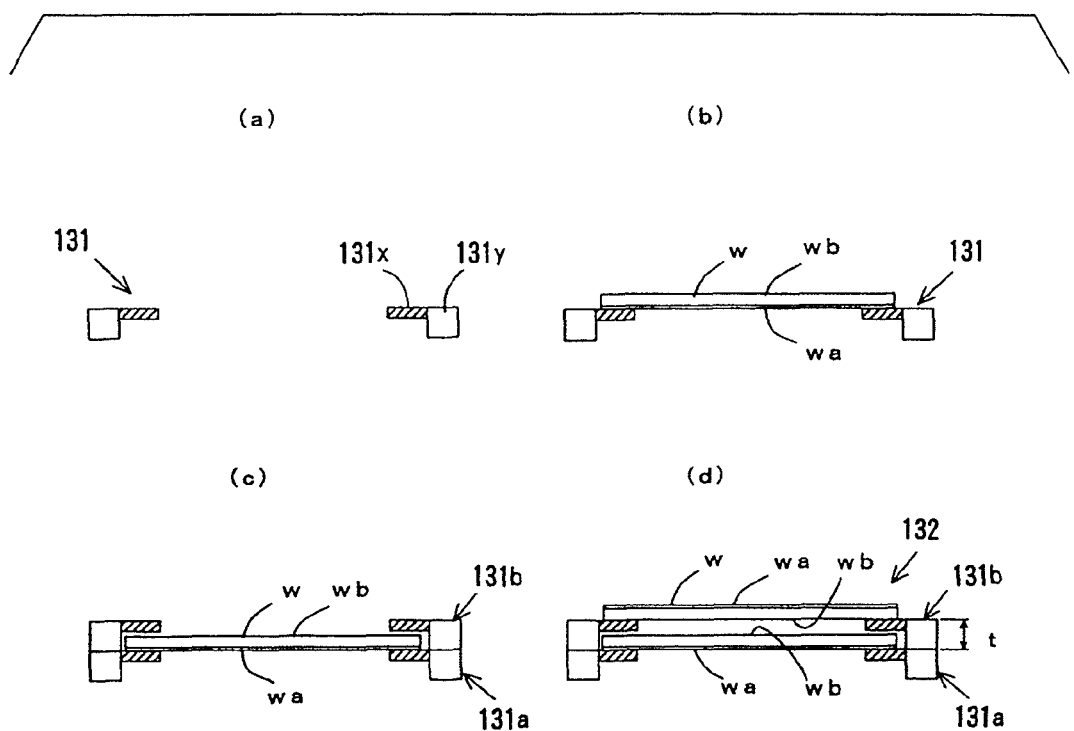
FIGS. 14(a) to 14(d) are diagrams schematically showing an example in which two wafers are held by a support ring under the condition that back surfaces of the wafers face each other.
Figure 15:
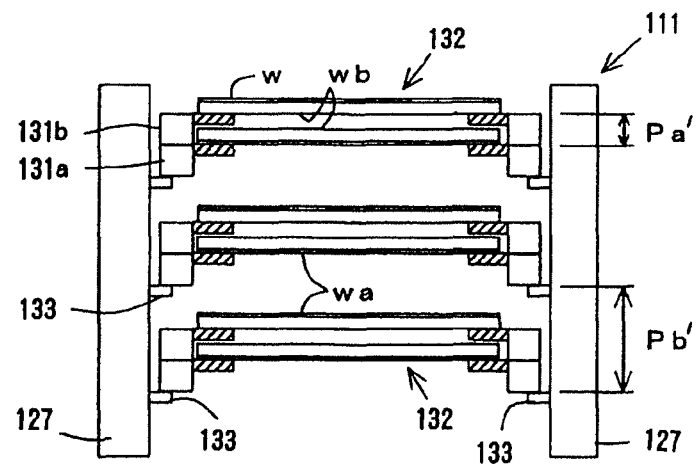
FIG. 15 is a front view schematically showing the state of a boat in which pairs of wafers are held by support rings at a predetermined vertical interval.
Figure 16:
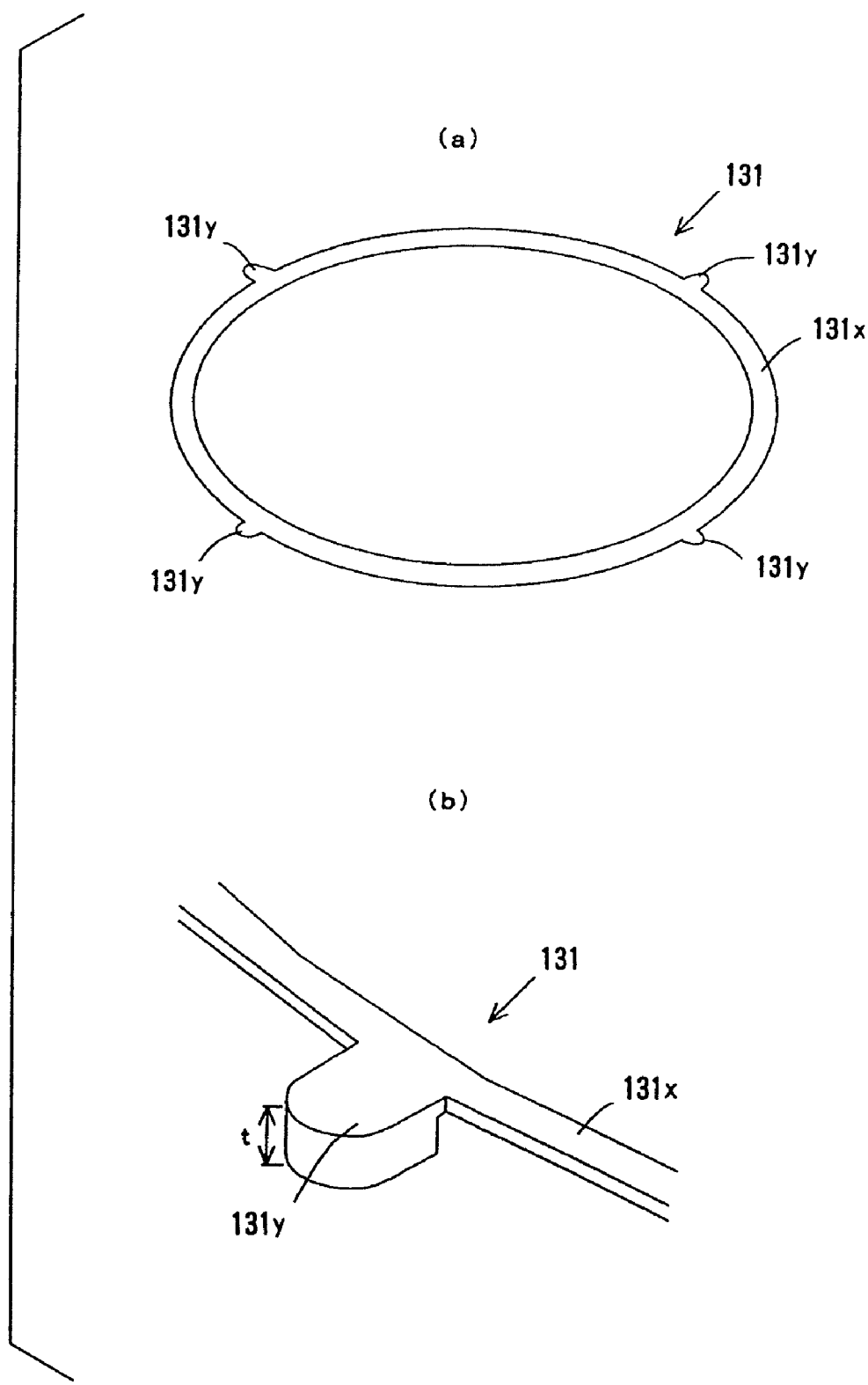
FIG. 16(a) is a perspective view schematically showing a support ring.
FIG. 16(b) is an enlarged perspective view showing a main part of the support ring.
Figure 17:
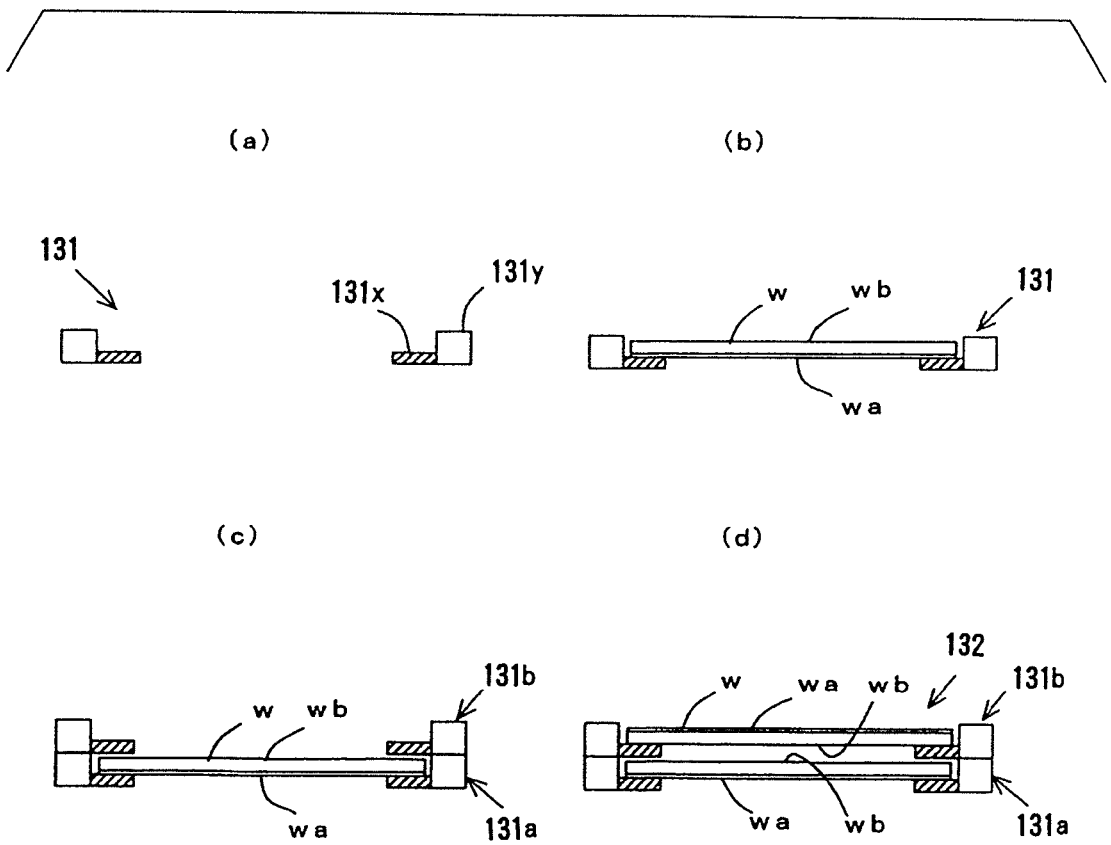
FIGS. 17(a) to 17(d) are diagrams schematically showing another example in which two wafers are held by the support ring under the condition that back surfaces of the wafers face each other.

As shown in FIGS. 14(a) to 15, the boat 111 holds a plurality of multi-plate units 132. In the multi-plate units 132, the circumferential portions of two wafers are hold by means of the support rings 131 in the vertical direction such that the back surfaces of the wafers face each other. A distance Pa' (shown in FIG. 15) between the back surface of one of the two wafers w held by the multi-plate unit 132 and the front surface of the other of the two wafers w is smaller than a distance Pb' (shown in FIG. 15) between upper surfaces of claws 133 (of the column 127) vertically adjacent to each other. The support rings 131 are made of quartz, for example. Each of the support rings 131 is composed of a first support ring 131a and a second support ring 131b. The first support ring 131a holds the horizontally-oriented wafer w under the condition that the back surface wb of the wafer w faces upward (the front surface wa of the wafer w faces downward). The second support ring 131b is provided on the first support ring 131a and holds the horizontally-oriented wafer w under the condition that the front surface wa of the wafer w faces upward.

Each of the first and second support rings 131a and 131b has a circular ring portion 131x and a plurality of, e.g., four protrusions 131y. The circular ring portion 131x has a diameter (outer diameter) that is the same as or slightly larger than that of the wafer. The protrusions 131y protrude from the circumference of the circular ring portion 131x and are arranged at an appropriate interval. In order to ensure a large area (to be treated) of the front surface wa (facing downward) of the wafer w placed on the circular ring portion 131x of the first support ring 131a, it is preferable that an inner diameter of the circular ring portion 131x of the first support ring 131a be maximized to a value close to the diameter of the wafer w.

It is preferable that an upper surface of the circular ring portion 131x and upper surfaces of the protrusions 131y be in the same plane. The protrusions 131y may protrude from the upper surface of the circular ring portion 131x to prevent the wafer from sliding and falling out of the boat. The protrusions 131y of the second support ring 131b are located on the protrusions 131y of the first support ring 131a. The thicknesses t of the protrusions 131y of the second support ring 131b are set such that the distance between the front surface of the wafer placed on the first support ring 131a and the back surface of the wafer placed on the second support ring 131b is maintained to the predetermined distance Pa'.

In order to assemble the multi-plate unit 132, a wafer w is first placed on the upper surface of the circular ring portion 131x of the first support ring 131a as shown in FIGS. 14(a) and 14(b). Next, the second support ring 131b is placed on the first support ring 131a as shown in FIGS. 14(c) and 14(d). Then, another wafer w is placed on the upper surface of the circular ring portion 131x of the second support ring 131b. The abovementioned assembly operation may be performed in the heat treatment apparatus 1. Alternatively, the pre-assembled multi-plate units 132 may be accommodated in the container 114.

Each of the columns 127 of the boat 111 has the claws 133 for holding the multi-plate units 132 at an interval (equal to the distance Pb') that is larger than the distance Pa' between the front surface of one of the two wafers w held by the multi-plate unit 132 and the back surface of the other of the two wafers w. That is, the protrusions 131y of the first support ring 131a of each multi-plate unit 132 are placed (latched) on upper surfaces of the claws 133 that hold the multi-plate unit 132. The distance (pitch) Pa' between the front surface of one of the two wafers w held by the multi-plate unit 132 and the back surface of the other of the two wafers w is equal to, for example, 2 mm. The distance (pitch) Pb' between the multi-plate units 132 held by the boat 111 is equal to, for example, 11 mm. Accordingly, the number of wafers to be held by the boat 111 can be increased by 25 wafers that can be accommodated in one container 114.

In the example of the drawings, the thicknesses of the protrusions 131y of the first support ring 131a are the same as those of the protrusions 131y of the second support ring 131b. The thicknesses of the protrusions 131y of the first support ring 131a may be the same as that of the circular ring portion 131x. The cross sections of the protrusions 131y are sufficiently smaller than those of the columns 127. Thus, the protrusions 131y do not have an impact on the wafers, unlike the columns 127 (that may have an impact on uniformity of the treated surface of each of the wafers since a portion of the treated surface of the wafer, which is located around the end portion of the wafer, is disturbed by the columns 127). In addition, since the support rings 131 are held by the claws 133 of the columns 127 by means of the protrusions 131y, the columns 127 are separated from the end portions of the wafers w. The end portions of the wafers w are placed on the upper surfaces of the respective circular ring portions 131x. It is therefore possible to perform the treatment uniformly on the surfaces of the wafers w including the end portions thereof in a similar manner to that to be performed in a ring boat.

According to the heat treatment method and the heat treatment apparatus 101 as described above, each of the multi-plate units 132 holds the end portions of two wafers by means of the support ring 131 in the boat 111. The wafers held by the multi-plate units 132 are arranged in the vertical direction. The distance Pb' between the multi-plate units 132 adjacent to each other is larger than the distance Pa' between the back surface of one of the two wafers held by the multi-plate unit 132 and the back surface of the other of the two wafers. Accordingly, the wafer with the front surface facing upward and the wafer with the back surface facing upward are alternately arranged in the vertical direction. The distance Pa' is smaller than the distance Pb'. Since the distance pa is set to ensure the uniformity of the treatment, and the distance pb is smaller than the distance pa, it is possible to increase the number of wafers to be held by the boat compared with conventional techniques and ensure the uniformity of the treatment. It is also possible to improve a throughput of the heat treatment apparatus. In addition, since each of the multi-plate units 132 holds end portions of two wafers with the back surfaces facing each other by means of the support ring 131, the two wafers do not stick to each other. In addition, the multi-plate units 132 can be accommodated in the container 114 one by one. Thus, two wafers can be transferred for each transfer operation. This operation is efficient and can reduce the time for transferring wafers. Also, the transfer operation makes it possible to improve the throughput. In this case, the distance pa is between one of the first pair of wafers and the other of the first pair of wafers, while the distance pb is between one of the second pair of wafers and the other of the second pair of wafers.

Figure 18:
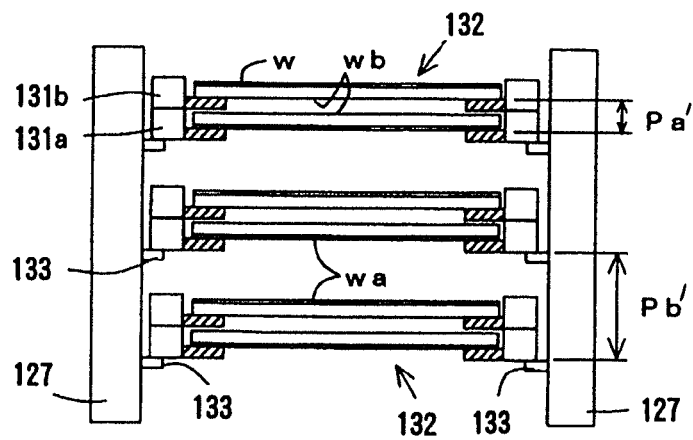
FIG. 18 is a front view schematically showing the state of a boat in which pairs of wafers are held by support rings at a predetermined vertical interval.

FIGS. 17(a) to 17(d) are diagrams schematically showing another example in which two wafers are held by the support ring under the condition that the back surfaces of the wafers face each other. FIG. 18 is a diagram showing pairs of wafers are held by the support rings in the boat at predetermined vertical intervals. In this example, the first support ring 131a and the second support ring 131b (that constitute the support ring 131 forming the multi-plate unit 132) are placed upside down (facing the opposite direction compared with those shown in FIG. 15). The lower surface of the circular ring portion 131x and the lower surfaces of the protrusions 131y are in the same plane. The upper surfaces of the protrusions 131y are located at positions higher than that of the front surface of the wafer placed on the circular ring portion 131x. In this case, the protrusions 131y surround the circumference of the wafer placed on the upper surface of the circular ring portion 131x to prevent the wafer from sliding and falling out of the boat. The boat having the configuration in this example can obtain a similar effect to the boat according to the first embodiment.

Figure 19:
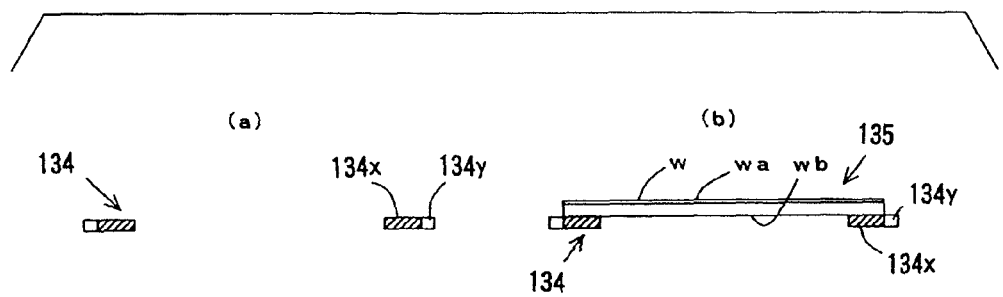
FIGS. 19(a) and 19(b) are diagrams schematically showing another example in which a wafer is held by a support ring.
Figure 20:
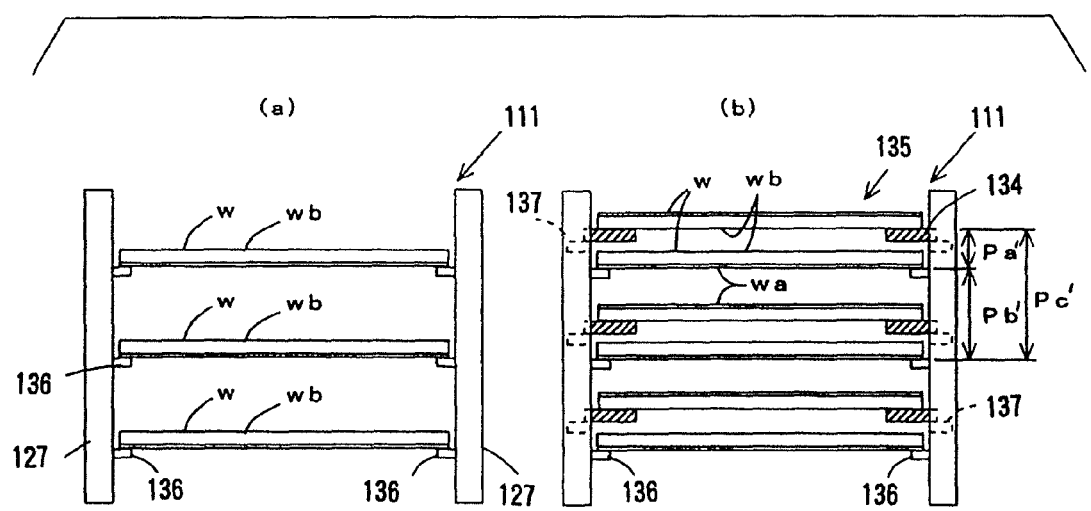
FIGS. 20(a) and 20(b) are front views each schematically showing the state of a boat in which each wafer having a back surface facing upward is directly held by the boat, and each wafer having a front surface facing upward is held by the boat by means of a support ring.
Figure 21:
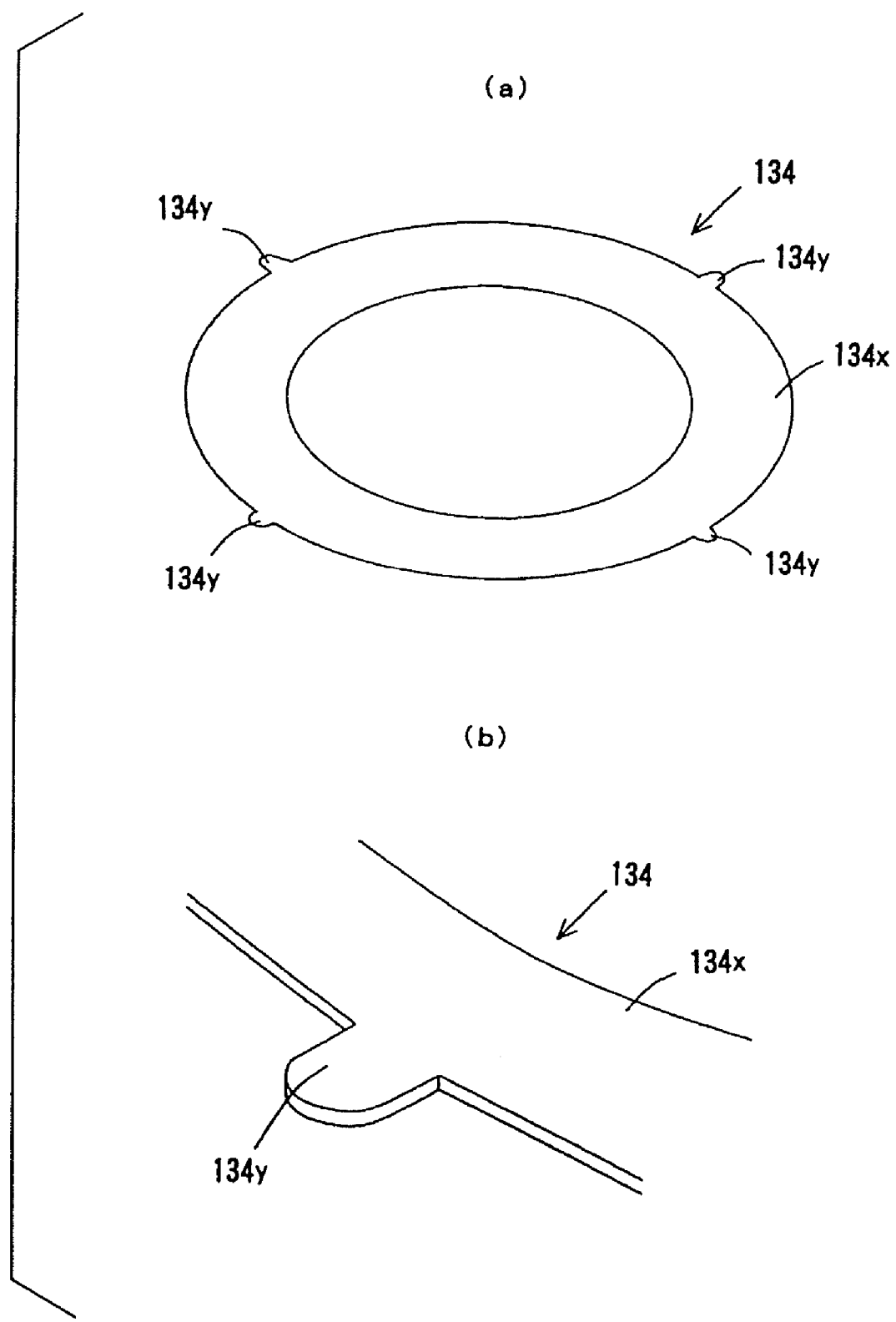
FIG. 21(a) is a perspective view schematically showing the entire support ring.
FIG. 21(b) is an enlarged perspective view showing a main part of the support ring.

FIGS. 19(a) and 19(b) are diagrams schematically showing another example in which a single wafer is held by the support ring. FIGS. 20(a) and 20(b) are front views each schematically showing the case in which a wafer having a back surface facing upward is held directly by the boat and a wafer having a front surface facing upward is held by the boat by means of the support ring. In this example, the boat 111 holds the wafer w with the back surface wb facing upward and a single-plate unit 135 that are alternately arranged at a predetermined vertical interval. The single-plate unit 135 is configured to hold the end portion of the wafer w by means of the support ring 134 under the condition that the front surface wa of the wafer w faces upward. In this case, the back surface of the wafer w directly held by the boat 111 and the back surface of the wafer w held by the single-plate unit 135 face each other. A distance Pa between the back surface of a wafer held by the single-plate unit 135 and the front surface of a wafer that is held by the claws 136 and located directly under the wafer held by the single-plate unit 135 is smaller than a distance Pb between the front surfaces of the wafers held by the claws vertically adjacent to each other.

The single-plate unit 135 is configured to hold the wafer w on the upper surface of the support ring 134 under the condition that the front surface wa (to be treated) of the wafer faces upward, as shown in FIG. 19(b). The support ring 134 has a circular ring portion 134x and a plurality of, for example, four protrusions 134y. The circular ring portion 134x has a diameter (outer diameter) that is the same as or slightly larger than the diameter of the wafer. The protrusions 134y protrude from the circumference of the circular ring portion 134x and are arranged at an appropriate interval. The thickness of the circular ring portion 134x is small, for example, 2.5 mm. The thickness of the circular ring portion 134x is the same as the thicknesses of the protrusions 134y. The circular ring portion 134x has an inner diameter that is not specified.

The single-plate unit 135 is assembled only by placing the wafer w on an upper surface of the circular ring portion 134x of the support ring 134 as shown in FIGS. 19(a) and 19(b). The single-plate unit 135 may be assembled in the heat treatment apparatus. Alternatively, the pre-assembled single-plate unit 135 may be accommodated in the container 114. In this case, as the container 114, a first container for accommodating wafers w and a second container for accommodating the single-plate unit 135 are used.

Figure 23:
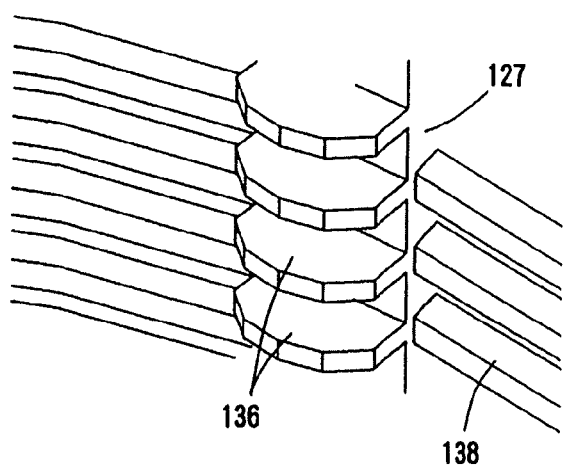
FIG. 23 is an enlarged view showing the boat shown in FIG. 22.
Figure 24:
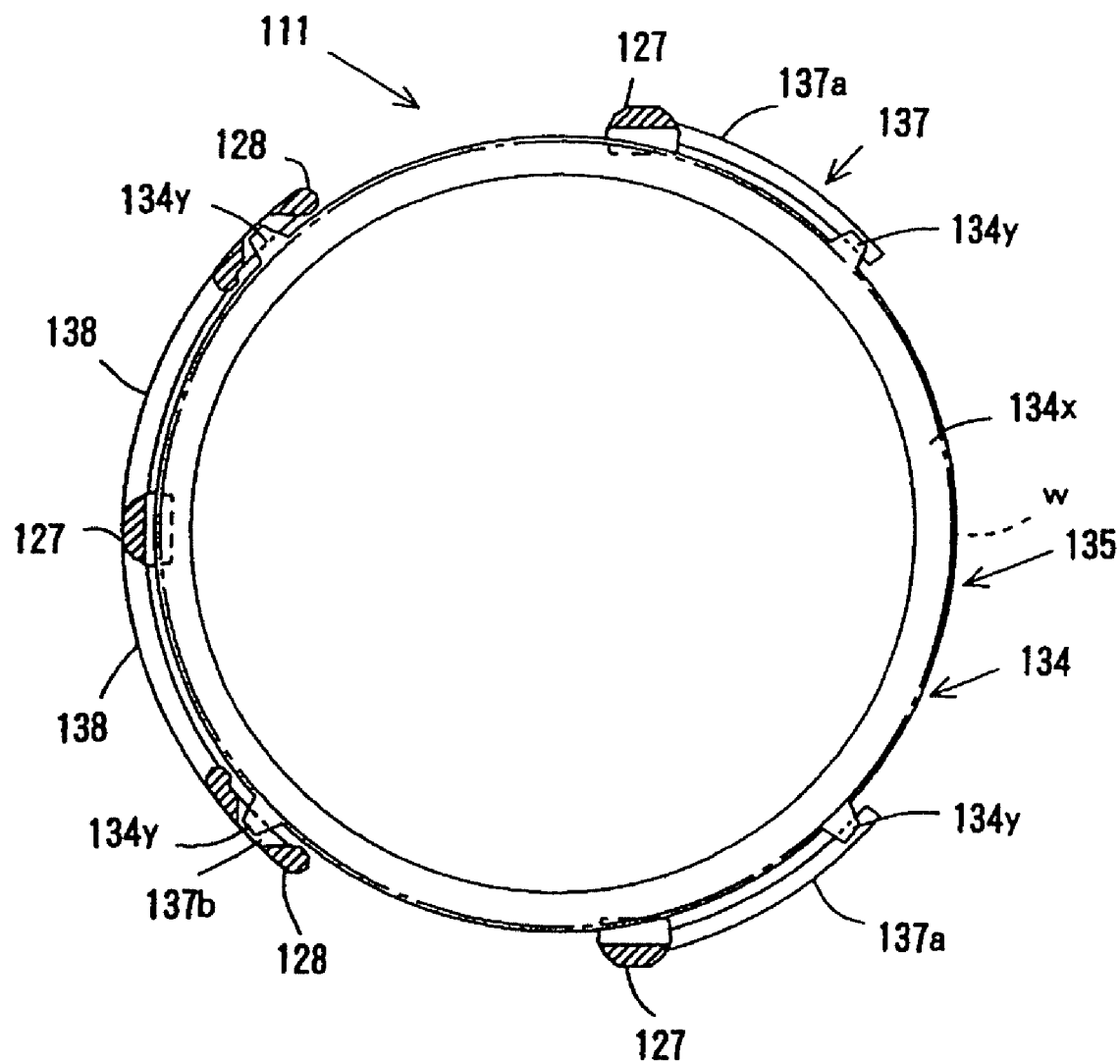
FIG. 24 is a plan view schematically showing the state of a support ring holding a wafer in the boat.

As shown in FIGS. 22 to 24, the boat 111 has the plurality of, for example, three columns 127 surrounding the end portions of the wafers. Each of the columns 127 has claws 136 and unit support sections 137. The claws 136 hold the wafers w. The unit support sections 137 hold the single-plate units 135 by means of the protrusions 134y of the support rings 134. The boat 111 shown in FIGS. 22 and 24 has a top plate 111a, a bottom plate 111b, the plurality of, e.g., three columns 127 and two auxiliary columns 128. The columns 127 and the auxiliary columns 128 are provided between the top plate 111a and the bottom plate 111b. The wafer w or the single-plate unit 135 is carried into (held by) the boat 111 from the right side of FIG. 24.

An imaginary line connecting between two of the columns 127 is perpendicular to the direction (left-right direction of FIG. 24) in which the wafer w is transferred and carried into the boat. The other one of the columns 127 is located on the side opposite to the side on which the wafer w is carried into the boat. Also, the other one of the columns 127 is located on an imaginary line that extends through the center of the wafer and is parallel to the direction in which the wafer w is transferred and carried into the boat. Each of the three columns 127 has the claws 136 at a predetermined vertical interval (pitch) PC. The claws hold the end portions of the wafers w. The following expression is established: Pc=Pa'+Pb'.

As the unit support section 137, flat arc front-side unit support sections 137a and a back-side unit support section 137b are provided. The front-side unit support sections 137a extend from the respective columns 127 that are located on the left and right sides with respect to the imaginary line that extends through the center of the wafer and is parallel to the direction in which the wafer w is carried into the boat. The front-side unit support sections 137a extend to the front side (right side of FIG. 24) and along the support ring 134. In addition, the front-side unit support sections 137a receive (hold) the respective protrusions 134y located on the front side of the support ring 134. A flat arc-shaped support plate 138 may be provided as the back-side unit support section 137b. In this case, the support plate 138 extends from one of the pair of auxiliary columns 128 through the columns 127 located on the back side to the other of the pair of auxiliary columns 128.

In the present embodiment, the wafers w are subsequently placed on the claws 136 of the boat 111 by the transfer mechanism 118 such that the front surfaces of the wafers w face upward, as shown in FIG. 20A. After that, the single-plate units 135 are held by the unit support sections 137 by means of the protrusions 134y. According to the present embodiment, the wafers w do not stick to each other. In addition, the number of wafers to be held by the boat 111 is increased compared with the conventional techniques while the uniformity of the treatment is ensured.

Although the embodiments of the present invention are described above, the present invention is not limited to the abovementioned embodiments and may be modified without departing the scope and spirit of the present invention.

What is claimed is:

1. A heat treatment apparatus comprising:
   a substrate holder for holding a plurality of substrates arranged at predetermined vertical intervals;
   a heat treating furnace for receiving the substrate holder and allowing a predetermined heat treatment to be performed on the substrates therein, wherein
   the substrate holder has a plurality of substrate holding sections for holding end portions of the substrates under the condition that a substrate having a front surface facing upward and a substrate having a back surface facing upward are alternately arranged in a vertical direction,
   the substrate holding sections are arranged such that a first distance between one of a first pair of substrates that are vertically adjacent each other and have respective front surfaces facing each other and the other of the first pair of substrates is set to ensure uniformity of the treatment and larger than a second distance between one of a second pair of substrates that are vertically adjacent each other and have respective back surfaces facing each other and the other of the second pair of substrates,
   the substrate holder is composed of two holder constituting bodies, each of the holder constituting bodies having a plurality of columns each including a plurality of substrate holding sections, the substrate holding sections of each of the holder constituting bodies being arranged at a predetermined vertical interval and adapted to hold circumferential portions of the substrates, the columns being arranged on the circumference of a same imaginary circle,
   one of the holder constituting bodies holds the substrates under the condition that the front surfaces of the substrates face upward, the other of the holder constituting bodies holds the substrates under the condition that the back surfaces of the substrates face upward, and the two holder constituting bodies are combined such that the substrate with the front surface facing upward and the substrate with the back surface facing upward are alternately arranged in the vertical direction, and
   at least one of the two holder constituting bodies is capable of moving up and down by a vertical movement mechanism to change the positions of the two holder constituting bodies relative to each other in order to ensure that the first distance is set to ensure the uniformity of the treatment and to be larger than the second distance; and
   a pivoting mechanism for pivoting at least one of the two holder constituting bodies in the circumferential direction to change the positions of the two holder constituting bodies relative to each other in order to ensure that the columns of the holder constituting bodies surround the circumferential portions of the substrates under the condition that a distance between any two of the columns is smaller than the diameters of the substrates.

2. The heat treatment apparatus according to claim 1, wherein
   a substrate holder rotating mechanism is provided under a lid for closing a furnace throat of the heat treating furnace and has a rotating shaft; and
   the vertical movement mechanism has an elevation shaft and an elevation drive section, the elevation shaft extending through the rotating shaft of the substrate holder rotating mechanism and being capable of moving up and down, the elevation drive section being adapted to cause the elevation shaft to move up and down.

3. The heat treatment apparatus according to claim 1, wherein
   a thermal insulation tube is provided on the lid for closing a furnace throat of the heat treating furnace,
   the vertical movement mechanism is composed of an elevation mechanism and a latch mechanism, the elevation mechanism being adapted to carry the holder constituting bodies of the substrate holder into and out of the heat treating furnace, the latch mechanism being adapted to latch one of the holder constituting bodies when the substrate holder is carried out of the heat treating furnace to restore the relationship between the position of the one of the holder constituting bodies relative to the position of the other of the holder constituting bodies.

4. The heat treatment apparatus according to claim 1, wherein
   a substrate holder rotating mechanism is provided under the lid for closing a furnace throat of the heat treating furnace and has a rotating shaft, and the pivoting mechanism has an elevation shaft extending through the rotating shaft and being capable of pivoting and moving up and down the holder constituting body.

5. The heat treatment apparatus according to claim 1, wherein
   the pivoting mechanism is composed of a latch mechanism and a substrate holder rotating mechanism, the latch mechanism being adapted to latch one of the holder constituting bodies when the substrate holder is carried out of the heat treating furnace in order to restore the relationship between the vertical position of the one of the holder constituting bodies relative to the vertical position of the other of the holder constituting bodies, the substrate holder rotating mechanism being adapted to pivot the other of the holder constituting bodies in the circumferential direction by a predetermined angle with respect to the holder constituting body latched by the latch mechanism.

* * * * *